(12) United States Patent
Kobayashi et al.

(10) Patent No.: US 11,881,177 B2
(45) Date of Patent: Jan. 23, 2024

(54) DISPLAY DEVICE AND ELECTRONIC DEVICE

(71) Applicant: Semiconductor Energy Laboratory Co., Ltd., Atsugi (JP)

(72) Inventors: Hidetomo Kobayashi, Isehara (JP); Kouhei Toyotaka, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 33 days.

(21) Appl. No.: 17/411,205

(22) Filed: Aug. 25, 2021

(65) Prior Publication Data

US 2021/0383762 A1  Dec. 9, 2021

Related U.S. Application Data

(63) Continuation of application No. 16/810,101, filed on Mar. 5, 2020, now Pat. No. 11,205,387, which is a
(Continued)

(30) Foreign Application Priority Data

Jul. 22, 2016 (JP) .................................. 2016-144075

(51) Int. Cl.
*G09G 3/3266* (2016.01)
*G09G 3/34* (2006.01)
(Continued)

(52) U.S. Cl.
CPC ......... *G09G 3/3266* (2013.01); *G09G 3/3233* (2013.01); *G09G 3/3426* (2013.01);
(Continued)

(58) Field of Classification Search
CPC ......... G09G 2310/0286; G09G 3/3266; G09G 3/3674–3681; G09G 2300/0426; G09G 2300/0809
See application file for complete search history.

(56) References Cited

U.S. PATENT DOCUMENTS 8,022,905 B2 *  9/2011  Yamashita ........... G09G 3/3266
                                                 345/76
8,319,528 B2 * 11/2012  Kimura ............ H03K 19/00369
                                                 327/108
(Continued)

FOREIGN PATENT DOCUMENTS

CN      101464590 A      6/2009
CN      104020602 A      9/2014
(Continued)

*Primary Examiner* — Patrick F Marinelli
(74) *Attorney, Agent, or Firm* — ROBINSON INTELLECTUAL PROPERTY LAW OFFICE, P.C.; Eric J. Robinson

(57) ABSTRACT

A display device that can be easily and more flexibly designed is provided. The display device includes a pixel circuit and a driver circuit in a display portion. The driver circuit includes a plurality of pulse output circuits. Each of the plurality of pulse output circuits has a function of driving a gate line. The pixel circuit is electrically connected to the gate line. Each of the plurality of pulse output circuits includes a first transistor. The pixel circuit includes a second transistor. A layer including the second transistor is over a layer including the first transistor, and the first transistor and the second transistor overlap with each other.

12 Claims, 20 Drawing Sheets

Related U.S. Application Data continuation of application No. 15/651,192, filed on Jul. 17, 2017, now Pat. No. 10,586,495.

(51) Int. Cl.
  *G09G 3/36* (2006.01)
  *G09G 3/3233* (2016.01)
  *H10K 59/121* (2023.01)

(52) U.S. Cl.
  CPC ..... *G09G 3/3648* (2013.01); *G09G 2300/023* (2013.01); *G09G 2300/046* (2013.01); *G09G 2300/0426* (2013.01); *G09G 2300/0439* (2013.01); *G09G 2300/0456* (2013.01); *G09G 2300/0809* (2013.01); *G09G 2300/0842* (2013.01); *G09G 2310/0286* (2013.01); *H10K 59/1213* (2023.02)

(56) References Cited

U.S. PATENT DOCUMENTS

| | | | |
|---|---|---|---|
| 8,378,403 | B2 | 2/2013 | Kato |
| 8,442,183 | B2 | 5/2013 | Amano et al. |
| 8,482,001 | B2 | 7/2013 | Yamazaki et al. |
| 8,541,846 | B2 | 9/2013 | Saito |
| 8,637,865 | B2 | 1/2014 | Kato |
| 8,693,617 | B2 | 4/2014 | Amano et al. |
| 8,766,285 | B2 | 7/2014 | Sagawa |
| 9,041,453 | B2 | 5/2015 | Miyake et al. |
| 9,070,323 | B2* | 6/2015 | Cok ............... G09G 3/3266 |
| 9,130,190 | B2 | 9/2015 | Sagawa |
| 9,269,915 | B2 | 2/2016 | Miyake |
| 9,287,258 | B2 | 3/2016 | Saito |
| 9,298,057 | B2 | 3/2016 | Hosaka et al. |
| 9,336,709 | B2* | 5/2016 | Lin ............... H01L 27/3248 |
| 9,396,812 | B2 | 7/2016 | Amano et al. |
| 9,478,187 | B2 | 10/2016 | Miyake et al. |
| 9,501,960 | B2* | 11/2016 | Park ............... G02F 1/13454 |
| 9,564,482 | B2 | 2/2017 | Teraguchi et al. |
| 9,640,599 | B2 | 5/2017 | Jinta |
| 9,685,131 | B2* | 6/2017 | Tanaka ............... G02F 1/1345 |
| 9,760,102 | B2* | 9/2017 | Tanaka ............... H01L 27/124 |
| 10,002,968 | B2 | 6/2018 | Yoneda |
| 10,026,796 | B2 | 7/2018 | Jinta |
| 10,101,628 | B2* | 10/2018 | Yamazaki ............... G02F 1/1368 |
| 10,103,212 | B2 | 10/2018 | Jinta |
| 10,121,841 | B2 | 11/2018 | Jinta |
| 10,141,381 | B2 | 11/2018 | Hsin et al. |
| 10,147,779 | B2 | 12/2018 | Jinta |
| 10,312,314 | B2 | 6/2019 | Jinta |
| 10,340,021 | B2 | 7/2019 | Amano et al. |
| 10,490,553 | B2 | 11/2019 | Yamazaki |
| 10,514,579 | B2 | 12/2019 | Hosaka et al. |
| 10,514,580 | B2 | 12/2019 | Hosaka et al. |
| 10,586,495 | B2* | 3/2020 | Kobayashi ............... G09G 3/2003 |
| 10,615,237 | B2 | 4/2020 | Jinta |
| 10,615,238 | B2 | 4/2020 | Jinta |
| 10,680,110 | B2 | 6/2020 | Yoneda |
| 11,004,924 | B2 | 5/2021 | Jinta |
| 11,205,387 | B2* | 12/2021 | Kobayashi ............... G09G 3/3413 |
| 11,209,710 | B2 | 12/2021 | Hosaka et al. |
| 11,233,109 | B2 | 1/2022 | Jinta |
| 11,251,247 | B2* | 2/2022 | Kim ............... H01L 27/3258 |
| 11,257,886 | B2* | 2/2022 | Bae ............... H01L 27/3276 |
| 11,302,819 | B2 | 4/2022 | Yoneda |
| 11,315,957 | B2* | 4/2022 | Lee ............... H01L 27/124 |
| 11,531,243 | B2 | 12/2022 | Hosaka et al. |
| 11,569,325 | B2 | 1/2023 | Jinta |
| 2010/0265224 | A1* | 10/2010 | Cok ............... B32B 37/24 345/206 |
| 2010/0309233 | A1* | 12/2010 | Choi ............... H01L 27/3262 345/77 |
| 2011/0031491 | A1 | 2/2011 | Yamazaki et al. |
| 2011/0089417 | A1 | 4/2011 | Yamazaki et al. |
| 2011/0216876 | A1* | 9/2011 | Amano ............... H01L 27/127 327/296 |
| 2012/0298998 | A1 | 11/2012 | Yamazaki et al. |
| 2012/0327060 | A1* | 12/2012 | Ohhashi ............... G02F 1/1345 345/204 |
| 2013/0169351 | A1 | 7/2013 | Chang et al. |
| 2013/0249857 | A1* | 9/2013 | Kimura ............... H01L 27/1255 257/296 |
| 2014/0078123 | A1* | 3/2014 | Park ............... G02F 1/13454 345/205 |
| 2014/0132491 | A1* | 5/2014 | Kim ............... G11C 19/28 327/108 |
| 2014/0138778 | A1 | 5/2014 | Kato |
| 2014/0145625 | A1 | 5/2014 | Yamazaki et al. |
| 2015/0206490 | A1* | 7/2015 | Lim ............... G09G 3/3677 327/109 |
| 2015/0206492 | A1* | 7/2015 | Lee ............... G09G 3/3648 345/94 |
| 2015/0255171 | A1 | 9/2015 | Nishi et al. |
| 2015/0279278 | A1* | 10/2015 | Park ............... G09G 3/3233 345/212 |
| 2015/0293546 | A1 | 10/2015 | Tanaka et al. |
| 2015/0310801 | A1* | 10/2015 | Lin ............... H01L 27/3276 345/205 |
| 2016/0019856 | A1* | 1/2016 | Tanaka ............... G09G 3/3666 345/206 |
| 2016/0064421 | A1 | 3/2016 | Oh et al. |
| 2016/0190149 | A1 | 6/2016 | Saito |
| 2016/0307488 | A1* | 10/2016 | Kim ............... G09G 3/3266 |
| 2016/0370635 | A1* | 12/2016 | Tanaka ............... G02F 1/1368 |
| 2017/0039976 | A1 | 2/2017 | Miyake et al. |
| 2017/0047032 | A1* | 2/2017 | Nishiyama ............... G09G 3/3677 |
| 2017/0047033 | A1* | 2/2017 | Tanaka ............... G09G 3/36 |
| 2017/0047038 | A1* | 2/2017 | Noma ............... G02F 1/136286 |
| 2017/0110459 | A1 | 4/2017 | Saito |
| 2017/0140679 | A1* | 5/2017 | Tomoda ............... G09F 9/3026 |
| 2017/0178586 | A1* | 6/2017 | Kim ............... G09G 3/003 |
| 2017/0186778 | A1 | 6/2017 | Miyake et al. |
| 2017/0221429 | A1* | 8/2017 | Kobayashi ............... H01L 29/7869 |
| 2017/0287381 | A1* | 10/2017 | Park ............... G02F 1/133512 |
| 2017/0287387 | A1* | 10/2017 | Eguchi ............... G09G 3/3413 |
| 2018/0012536 | A1* | 1/2018 | Shishido ............... H01L 29/7869 |
| 2018/0012549 | A1* | 1/2018 | Lee ............... H01L 27/323 |
| 2018/0026218 | A1* | 1/2018 | Kobayashi ............... G09G 3/3233 349/143 |
| 2019/0392914 | A1 | 12/2019 | Amano et al. |
| 2020/0111855 | A1* | 4/2020 | Bae ............... H01L 27/3262 |
| 2020/0202789 | A1* | 6/2020 | Kobayashi ............... G09G 3/2003 |
| 2021/0383762 | A1* | 12/2021 | Kobayashi ............... G09G 3/3233 |
| 2022/0123139 | A1 | 4/2022 | Yoneda |
| 2023/0363204 | A1 | 11/2023 | Jinta |

FOREIGN PATENT DOCUMENTS

| | | |
|---|---|---|
| CN | 104716167 A | 6/2015 |
| JP | 2007-108771 A | 4/2007 |
| JP | 2010-026350 A | 2/2010 |
| JP | 2010-117549 A | 5/2010 |
| JP | 2010-244808 A | 10/2010 |
| JP | 2011-205630 A | 10/2011 |
| JP | 2012-069540 A | 4/2012 |
| JP | 2013-145878 A | 7/2013 |
| JP | 2013-225620 A | 10/2013 |
| JP | 2013-232567 A | 11/2013 |
| JP | 2014-211621 A | 11/2014 |
| JP | 2015-084090 A | 4/2015 |
| JP | 2015-194577 A | 11/2015 |
| JP | 2016-128912 A | 7/2016 |
| WO | WO-2011/108678 | 9/2011 |
| WO | WO-2014/014039 | 1/2014 |
| WO | WO-2014/054515 | 4/2014 |
| WO | WO-2014/069529 | 5/2014 |
| WO | WO-2015/037327 | 3/2015 |
| WO | WO-2016/165278 | 10/2016 |

* cited by examiner

DISPLAY DEVICE AND ELECTRONIC DEVICE

BACKGROUND OF THE INVENTION

1. Field of the Invention

The present invention relates to an object, a method, or a manufacturing method. The present invention relates to a process, a machine, manufacture, or a composition of matter. Specifically, one embodiment of the present invention relates to a semiconductor device, a light-emitting device, a display device, an electronic device, a lighting device, a driving method thereof, or a manufacturing method thereof. In particular, one embodiment of the present invention relates to a display device (display panel). Another embodiment of the present invention relates to an electronic device, a light-emitting device, or a lighting device that includes a display device, or a manufacturing method thereof.

In this specification and the like, a semiconductor device generally refers to a device that can function by utilizing semiconductor characteristics. A transistor, a semiconductor circuit, an arithmetic device, a memory device, and the like are each an embodiment of the semiconductor device. A light-emitting device, a display device, an electronic device, a lighting device, and an electronic device may include a semiconductor device.

2. Description of the Related Art

A display device such as a liquid crystal display device or an electroluminescence (EL) display device that is used for an electronic device or other devices has been required to have a narrower bezel so as to be reduced in size and designed more freely. In order to narrow a bezel, it is effective to provide a pixel circuit and a part or the whole of a driver circuit over one substrate.

The driver circuit is commonly formed using complementary metal oxide semiconductor (CMOS) circuits; however, the driver circuit can be formed using transistors having the same conductivity. For example, Patent Document 1 discloses a technique in which circuits such as shift registers are formed using transistors having the same conductivity.

Providing circuits such as shift registers in a region where pixels are provided (i.e., a pixel region) for narrowing a bezel is also proposed. For example, Patent Document 2 discloses providing gate drivers in a pixel region so as to increase design flexibility.

REFERENCE

Patent Document

[Patent Document 1] Japanese Published Patent Application No. 2014-211621
[Patent Document 2] PCT International Publication No. 2014-69529

SUMMARY OF THE INVENTION

According to Patent Document 2, gate drivers are dispersedly provided in a pixel region. Thus, pixel circuits each including a transistor that constitutes a gate driver and pixel circuits without a transistor that constitutes a gate driver are provided in a mixed manner. In that case, the pixel circuit including a transistor that constitutes a gate driver makes the area of a pixel larger, as compared with the pixel circuit without such a transistor, which is problematic because it hinders increase of resolution.

In addition, when pixel circuits each including a transistor that constitutes a gate driver and pixel circuits without a transistor that constitutes a gate driver are provided in a mixed manner, the circuit design is more complex because two different kinds of pixel circuits are included. Similarly, wirings for connecting transistors that constitute a gate driver have different connection relations from each other, which is also problematic because it makes the circuit design more complex.

An object of one embodiment of the present invention is to provide a display device with a narrow bezel. Another object is to provide a display device that can improve design flexibility. Another object is to provide a display device including pixel circuits that can increase resolution. Another object is to provide a display device that can prevent the circuit design from becoming complex. Another object is to provide a low-power display device. Another object is to provide a novel display device. Another object is to provide an electronic device with the display device (display panel). Another object is to provide a novel electronic device.

Note that the description of these objects does not preclude the existence of other objects. In one embodiment of the present invention, there is no need to achieve all the objects. Other objects will be apparent from and can be derived from the description of the specification and the like.

According to one embodiment of the present invention, a layer including transistors that constitute pixel circuits and a layer including transistors that constitute a driver circuit are stacked in a display portion. That is, transistors that constitute pixel circuits are provided in an upper layer, and transistors that constitute a gate driver, which is a driver circuit, are provided in a lower layer. The gate driver, which is generally provided in a bezel portion, is provided in the lower layer in the display portion; whereby improvement in design flexibility such as a narrower bezel can be achieved. In addition, transistors that constitute pixel circuits are provided in the upper layer in the display portion, so that the upper layer is designed to have repetition of the same circuit layout; whereby the circuit design can be prevented from becoming complex.

One embodiment of the present invention is a display device including a pixel circuit and a driver circuit in a display portion. The driver circuit includes a plurality of pulse output circuits. Each of the plurality of pulse output circuits is configured to drive a gate line. The pixel circuit is electrically connected to the gate line. Each of the plurality of pulse output circuits includes a first transistor. The pixel circuit includes a second transistor. A layer including the second transistor is over a layer including the first transistor. The first transistor and the second transistor overlap with each other.

Another embodiment of the present invention is a display device including a pixel circuit and a driver circuit in a display portion. The driver circuit includes a plurality of pulse output circuits. Each of the plurality of pulse output circuits is configured to drive a gate line. The pixel circuit is electrically connected to the gate line. Each of the plurality of pulse output circuits includes a first transistor. The pixel circuit includes a second transistor. A layer including the second transistor is over a layer including the first transistor. The first transistor and the second transistor overlap with each other. A conductive layer serving as the gate line is provided in the layer including the first transistor.

In the display device of one embodiment of the present invention, the first transistor and the second transistor preferably have the same polarity.

In the display device of one embodiment of the present invention, a channel formation region of the first transistor and a channel formation region of the second transistor each preferably include a metal oxide.

In the display device of one embodiment of the present invention, the pixel circuit preferably further includes a first display element, and the first display element is preferably capable of emitting visible light or transmitting visible light.

In the display device of one embodiment of the present invention, the pixel circuit preferably further includes a second display element, and the second display element is preferably capable of reflecting visible light.

In the display device of one embodiment of the present invention, the pixel circuit preferably further includes a third transistor, and the third transistor is preferably in the layer including the first transistor.

Note that in this specification, the display device may include any of the following modules in its category: a module in which a connector such as a flexible printed circuit (FPC) or a tape carrier package (TCP) is attached to a display element; a module having a TCP provided with a printed wiring board at the end thereof; and a module having an integrated circuit (IC) directly mounted by a chip on glass (COG) method on a substrate over which a display element is formed.

One embodiment of the present invention can provide a display device with a narrow bezel. Another embodiment of the present invention can provide a display device that can improve design flexibility. Another embodiment of the present invention can provide a display device including pixel circuits that can increase resolution. Another embodiment of the present invention can provide a display device that can prevent the circuit design from becoming complex. Another embodiment of the present invention can provide a low-power display device. Another embodiment of the present invention can provide a novel display device. Another embodiment of the present invention can provide an electronic device with the display device (display panel). Another embodiment of the present invention can provide a novel electronic device.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 15A, 15B1, and 15B2 are a block diagram illustrating a display device and drawings illustrating electrodes included in pixels;

DETAILED DESCRIPTION OF THE INVENTION

Figure 1A:
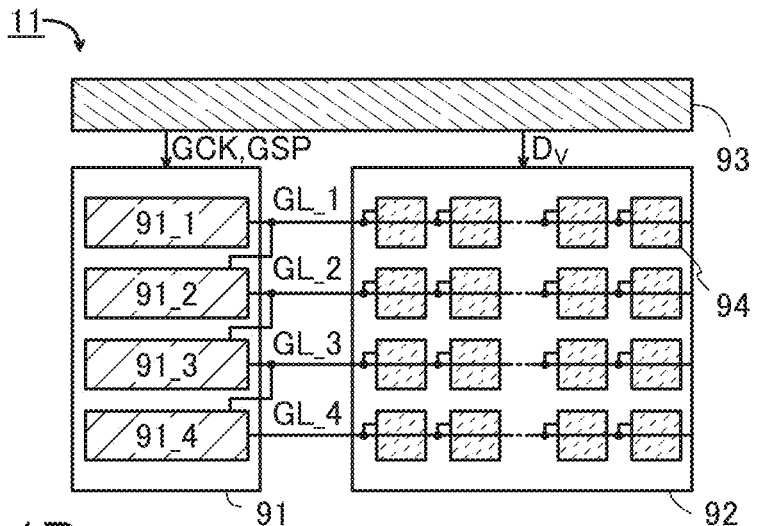
FIGS. 1A to 1C each illustrate a display device.

Embodiments will be described in detail with reference to the drawings. However, the present invention is not limited to the following description and it will be readily appreciated by those skilled in the art that modes and details can be modified in various ways without departing from the spirit and the scope of the present invention. Thus, the present invention should not be interpreted as being limited to the description of embodiments below.

Note that in the structures of the invention described below, the same portions or portions having similar functions are denoted by the same reference numerals in different drawings, and repetitive description thereof will be omitted. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first," "second," and the like are used in order to avoid confusion among components and do not limit the number.

Embodiment 1

In a display portion of a display device of one embodiment of the present invention, a layer including transistors that constitute pixel circuits and a layer including transistors that constitute a driver circuit are stacked. That is, transistors that constitute pixel circuits are provided in an upper layer, and transistors that constitute a gate driver, which is a driver circuit, are provided in a lower layer. The gate driver, which is generally provided in a bezel portion, is provided in the lower layer in the display portion; whereby improvement in design flexibility such as a narrower bezel can be achieved. In addition, transistors that constitute pixel circuits are provided in the upper layer in the display portion, so that the upper layer is designed to have repetition of the same circuit layout; whereby the circuit design can be prevented from becoming complex.

<Structure Example of Display Device>

A structure of the display device will be described with reference to the drawings.

FIG. 1A is a drawing for describing the structure of the display device. A display device 11 includes a driver circuit 91, a display portion 92, and a driver circuit 93. The display portion 92 includes a plurality of pixel circuits 94 and display elements. A combination of the pixel circuit 94 and the display element may be referred to as a pixel.

The driver circuit 91 includes a plurality of pulse output circuits. A gate clock signal GCK and a gate start pulse GSP are input from the driver circuit 93 to the driver circuit 91. The driver circuit 91 has a function of a gate line driver circuit. In FIG. 1A, pulse output circuits 91_1 to 91_4 are shown as examples of the plurality of pulse output circuits. The pulse output circuits 91_1 to 91_4 each have a function of a shift register, and output scan signals through gate lines GL_1 to GL_4 to the pixel circuits 94.

The pulse output circuits 91_1 to 91_4 in the driver circuit 91 each include a plurality of transistors. In the driver circuit 91, transistors having the same polarity constitute a circuit such as a shift register.

The driver circuit 93 is an integrated circuit having a function of a source line driver circuit and a display controller. Specifically, the driver circuit 93 has a function of outputting a gate clock signal GCK and a gate start pulse GSP to the driver circuit 91 and outputting image data Dv through source lines (not illustrated) to the pixel circuits 94.

The pixel circuit 94 is a circuit for controlling voltage or current to be supplied to a display element in accordance with voltage corresponding to image data. The display element is an element, such as a liquid crystal element or an EL display element, which can control gray scale in accordance with voltage or current.

The pixel circuit 94 includes a plurality of transistors. As with the circuit such as a shift register, the transistors included in the pixel circuit have the same polarity.

Figure 1B:
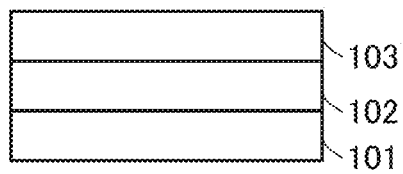

FIG. 1B is a drawing for describing a layered structure of the display device 11 in FIG. 1A. In the display device 11, a layer 101 including the transistors that constitute the driver circuit 91, a layer 102 including the transistors that constitute the pixel circuits 94, and a layer 103 including display elements are stacked.

Figure 1C:
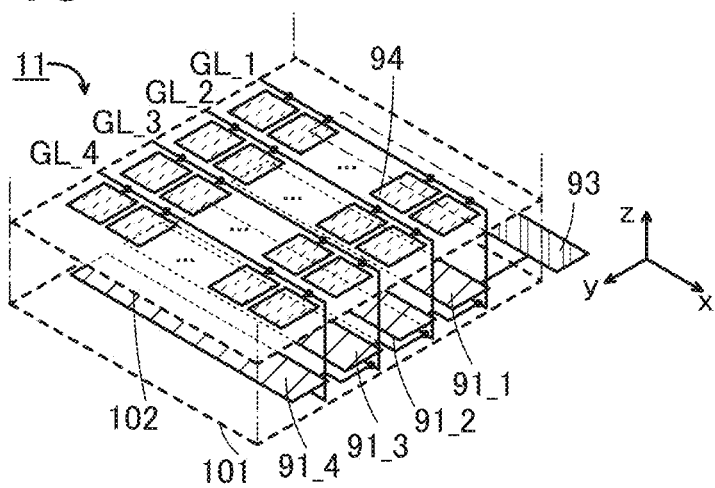

FIG. 1C is a drawing in which the layered structure in FIG. 1B is reflected in the structure of the display device 11 illustrated in FIG. 1A. In FIG. 1C, the x direction, the y direction, and the z direction are shown. The x direction is parallel to the gate lines GL_1 to GL_4 as illustrated in FIG. 1C. They direction is parallel to the source lines. The z direction is perpendicular to a plane determined by the x direction and the y direction as illustrated in FIG. 1C.

The layer 101 including the transistors that constitute the driver circuit 91 and the layer 102 including the transistors that constitute the pixel circuits 94 are illustrated in FIG. 1C. The layer 101 includes the pulse output circuits 91_1 to 91_4. The layer 102 includes the pixel circuits 94 and the gate lines GL_1 to GL_4. Note that the driver circuit 93 illustrated in FIG. 1C is preferably provided in a layer different from the layer 101 and the layer 102.

As illustrated in FIGS. 1A to 1C, the display device 11 of one embodiment of the present invention has a layered structure in which the layer 102 including the transistors that constitute the pixel circuits 94 and the layer 101 including the transistors that constitute the driver circuit 91 including the pulse output circuits 91_1 to 91_4 are stacked, in the display portion 92 with the pixel circuits 94. With the structure, the driver circuit 91 serving as a gate driver, which is generally provided in a bezel portion, is provided in the lower layer in the display portion 92. In this way, improvement of design flexibility such as a narrower bezel can be achieved. In addition, the transistors that constitute the pixel circuits 94 are provided in the upper layer in the display portion 92, so that the upper layer is designed to have repetition of the pixel circuits 94 having the same circuit layout; whereby the circuit design can be prevented from becoming complex.

Although in FIGS. 1A to 1C the pulse output circuits 91_1 to 91_4 are shown as the pulse output circuits included in the driver circuit 91, other structures may be employed.

Figure 2A:
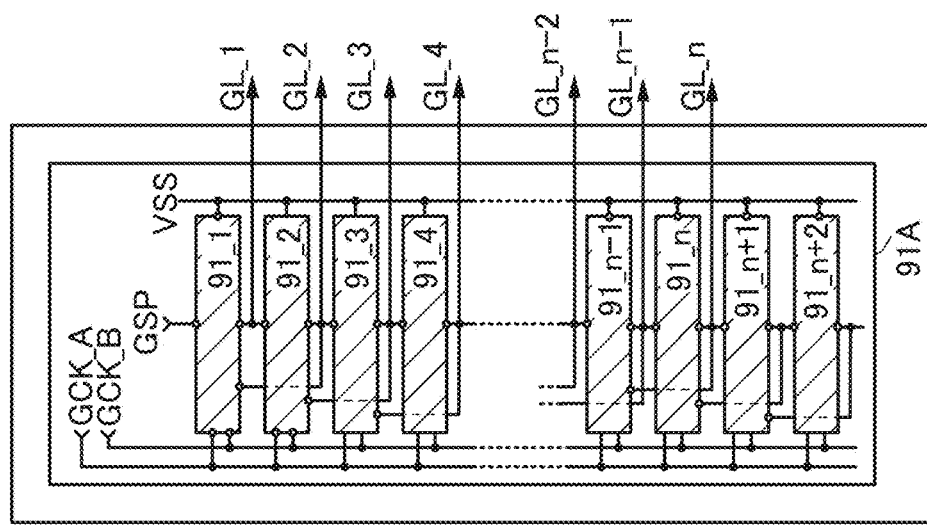
FIGS. 2A and 2B each illustrate a display portion.

For example, the display portion 92 in FIG. 2A includes a driver circuit 91A and pixel circuits (not illustrated) stacked thereover. The driver circuit 91A includes pulse output circuits 91_1 to 91_n+2 (n is a natural number). Gate clock signals GCK_A and GCK_B, a gate start pulse GSP, and a potential VSS are supplied to the driver circuit 91A. Output signals from the pulse output circuits 91_1 to 91_n are output as scan signals to gate lines GL_1 to GL_n. An output signal from the pulse output circuit 91_n+1 and an output signal from the pulse output circuit 91_n+2 are each a signal for resetting the pulse output circuit in the previous stage.

Figure 2B:
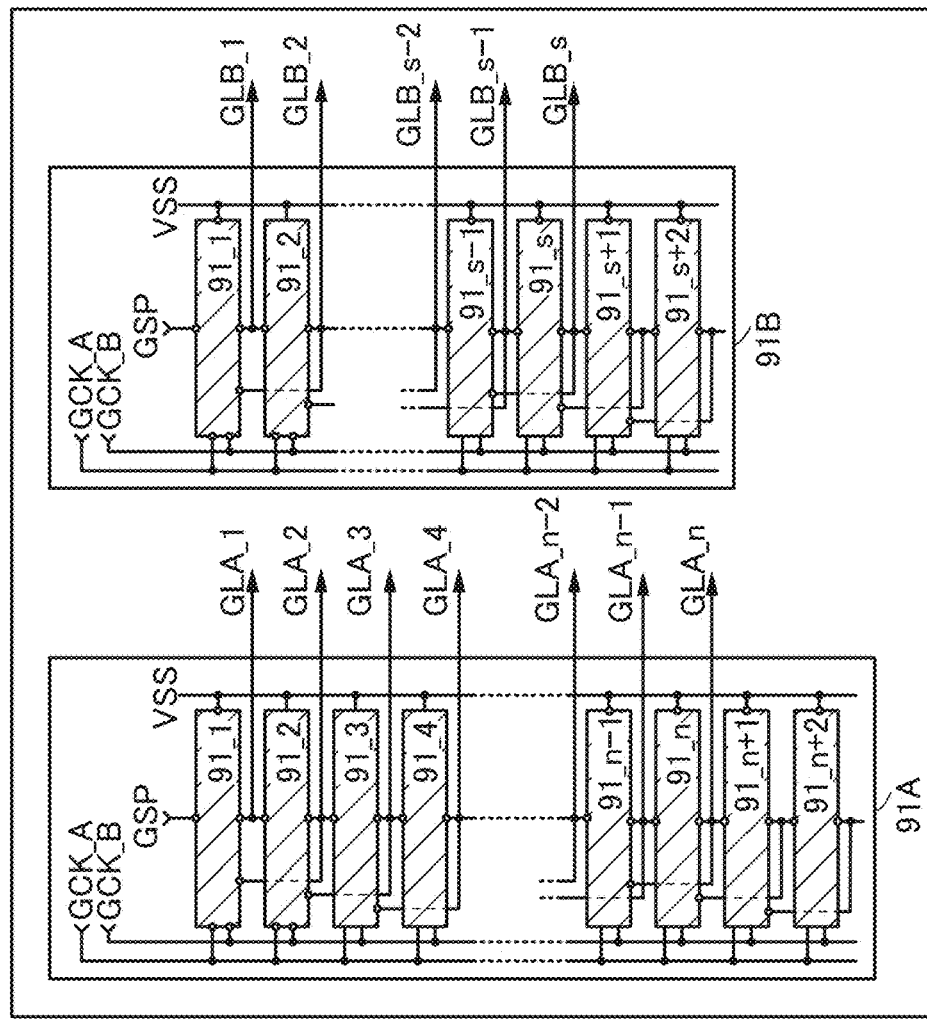

In another example, the display portion 92 may include the driver circuit 91A and a driver circuit 91B in which the number of pulse output circuits is different from that in the driver circuit 91A, as illustrated in FIG. 2B. The driver circuits 91A and 91B, with the pixel circuits (not illustrated) stacked thereover, are provided in the display portion 92.

Gate clock signals GCK_A and GCK_B, a gate start pulse GSP, a potential VSS are supplied to the driver circuit 91A. Output signals from the pulse output circuits 91_1 to 91_n are output as scan signals to gate lines GLA_1 to GLA_n. An output signal from the pulse output circuit 91_n+1 and an output signal from the pulse output circuit 91_n+2 are each a signal for resetting the pulse output circuit in the previous stage.

The driver circuit 91B includes pulse output circuit 91_1 to 91_s+2 (s is a natural number). Gate clock signals GCK_A and GCK_B, a gate start pulse GSP, and a potential VSS are supplied to the driver circuit 91B. Output signals from the pulse output circuits 91_1 to 91_s are output as scan signals to gate lines GLB_1 to GLB_s. An output signal from the pulse output circuit 91_s+1 and an output signal from the pulse output circuit 91_s+2 are each a signal for resetting the pulse output circuit in the previous stage.

Figure 3:
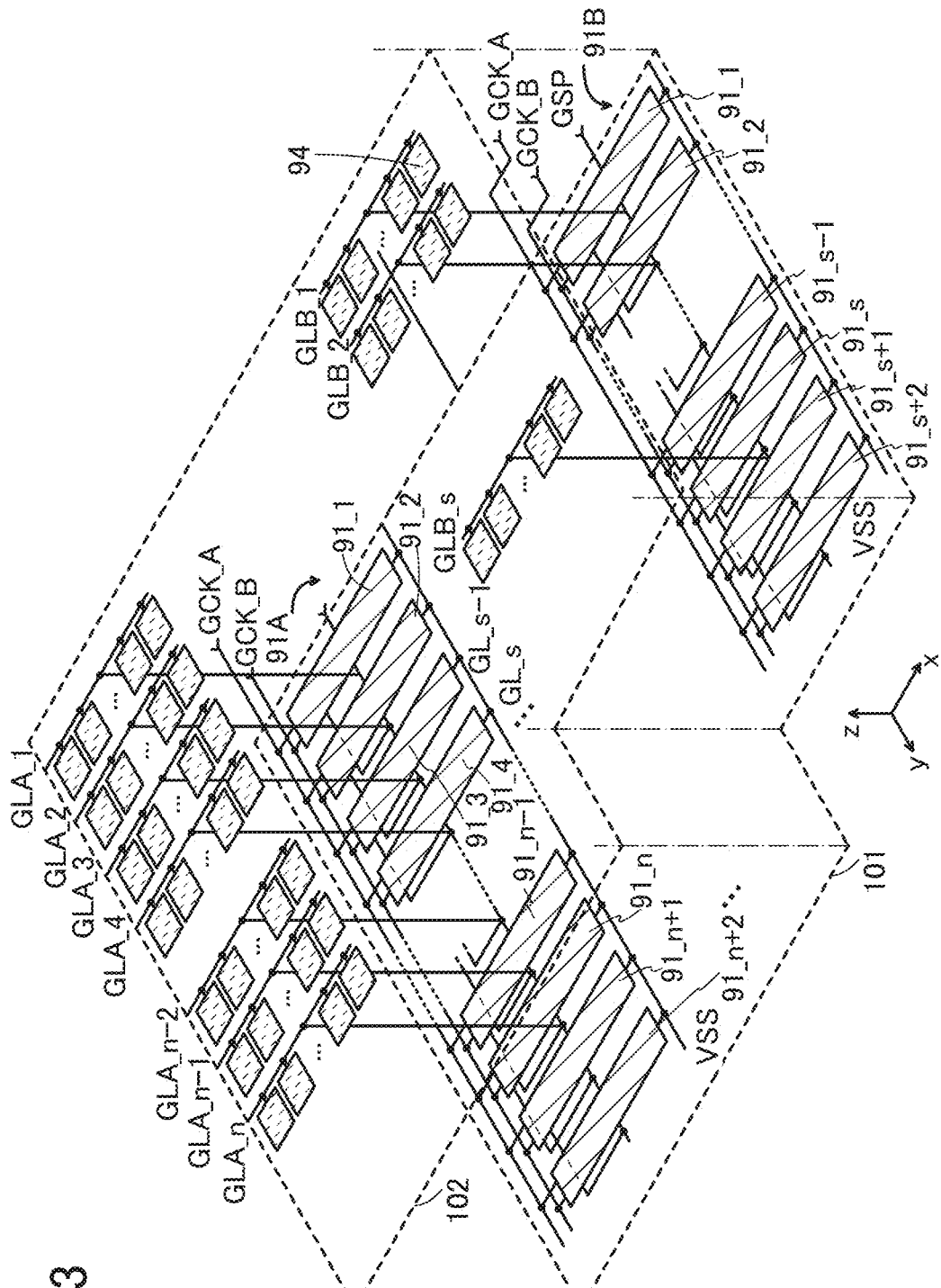
FIG. 3 illustrates a display portion.

Similarly to FIG. 1C, FIG. 3 is a drawing in which the layered structure in FIG. 1B is reflected in the structure of the display portion 92 including the driver circuits 91A and 91B illustrated in FIG. 2B.

FIG. 3 illustrates the layer 101 including transistors of the pulse output circuits 91_1 to 91_n+2 and transistors of the pulse output circuits 91_1 to 91_s+2, and the layer 102 including transistors that constitute the pixel circuits 94. The driver circuit 93, which is illustrated in FIG. 1C, is omitted in FIG. 3.

When the pulse output circuits differ in number between the driver circuits 91A and 91B in FIG. 2B as illustrated in FIG. 3, the number of pixels in the y direction can have variations. Thus, the shape of the display portion can be more flexibly designed.

Figure 4A:
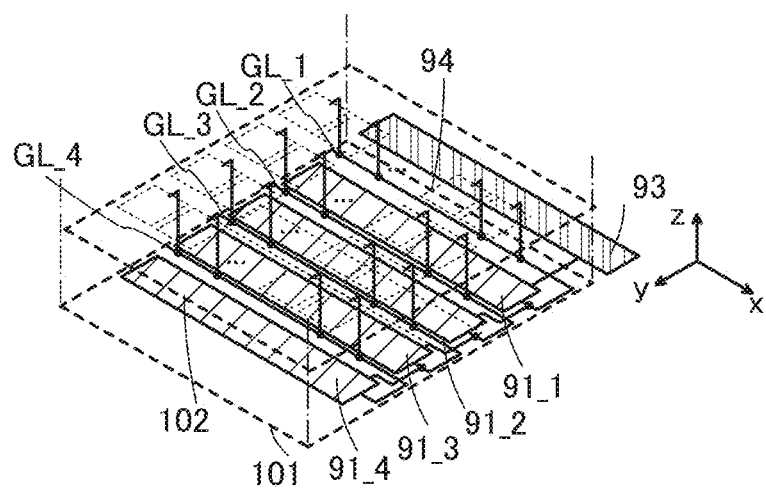
FIGS. 4A and 4B each illustrate a display portion.
Figure 4B:
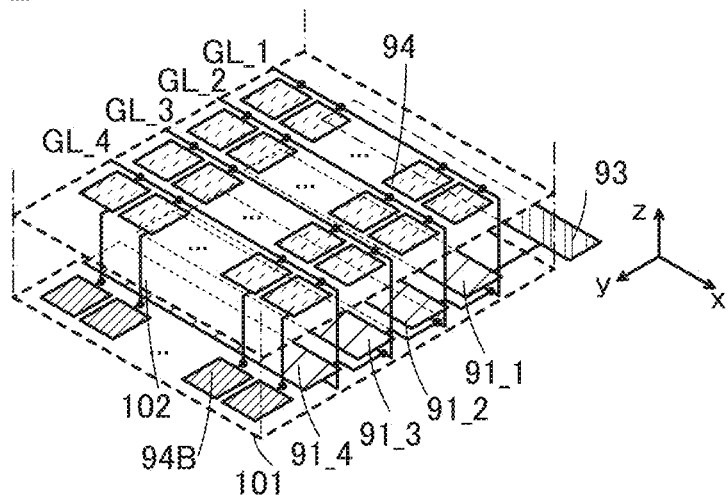

The gate lines GL_1 to GL_4 may be provided in the layer 101 as illustrated in FIG. 4A, although they are provided in the layer 102 in FIG. 1C. Circuits 94B, which are some of the pixel circuits, may be provided in the layer 101 as illustrated in FIG. 4B, although all of the pixel circuits 94 are provided in the layer 102 in FIG. 1C.

As described above, in the display portion of the display device of one embodiment of the present invention, a layer including transistors that constitute pixel circuits and a layer including transistors that constitute a driver circuit are stacked. That is, transistors that constitute pixel circuits are provided in an upper layer, and transistors that constitute a gate driver, which is the driver circuit, are provided in a lower layer. The gate driver, which is generally provided in a bezel portion, is provided in the lower layer in the display portion; whereby improvement in design flexibility such as a narrower bezel can be achieved. In addition, the transistors that constitute the pixel circuits are provided in the upper layer in the display portion, so that the upper layer is designed to have repetition of the same circuit layout; whereby the circuit design can be prevented from becoming complex.

<Structural Example of Pixel Circuit>

Figure 5A:
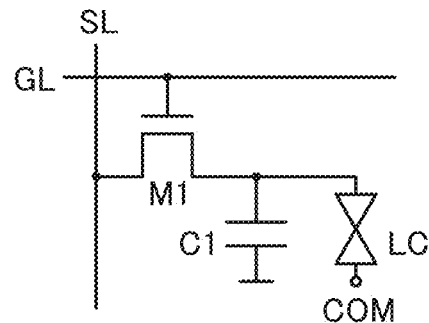
FIGS. 5A to 5C are circuit diagrams each illustrating a pixel circuit.
Figure 5B:
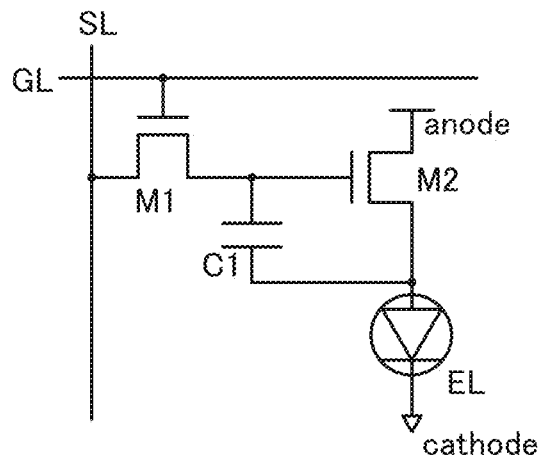
Figure 5C:
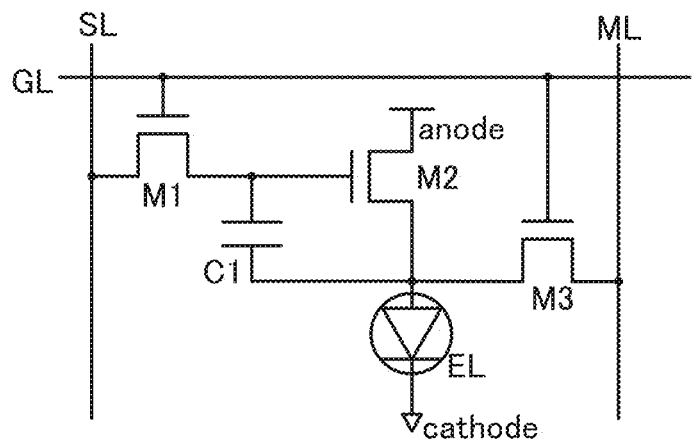

FIGS. 5A to 5C each illustrate an example of the pixel circuit. Note that in FIGS. 5A to 5C the pixel circuit is shown together with a display element.

FIG. 5A is an example of the pixel circuit in which the display element is a liquid crystal element. In FIG. 5A, a transistor M1, a capacitor C1, a liquid crystal element LC, a common electrode COM, a source line SL, and a gate line GL are shown.

FIG. 5B is an example of the pixel circuit in which the display element is a light-emitting element. In FIG. 5B, the transistor M1, a transistor M2, the capacitor C1, a light-emitting element EL, an anode line "anode", a cathode line "cathode", the source line SL, and the gate line GL are shown.

FIG. 5C is an example of the pixel circuit in which the display element is a light-emitting element, which is different from the example in FIG. 5B. In FIG. 5C, the transistor M1, the transistor M2, a transistor M3, the capacitor C1, the light-emitting element EL, the anode line "anode", the cathode line "cathode", a monitor line ML, the source line SL, and the gate line GL are shown.

<Structural Example of Driver Circuit>

Figure 6A:
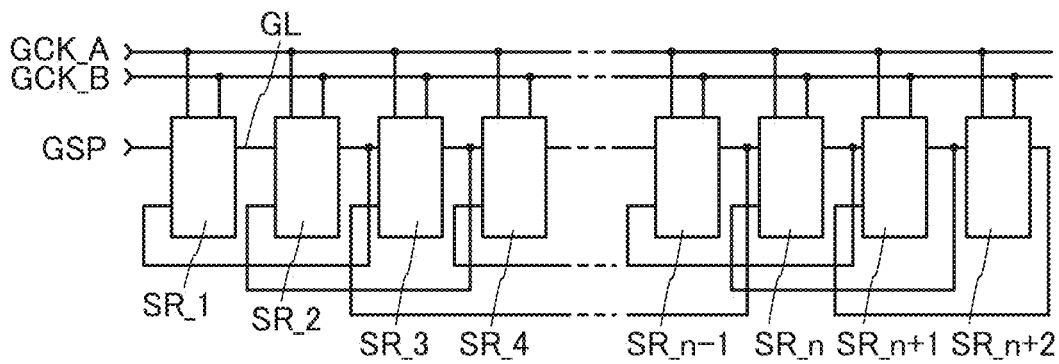
FIGS. 6A to 6C are a drawing, a circuit diagram, and a timing chart for describing a driver circuit.
Figure 6B:
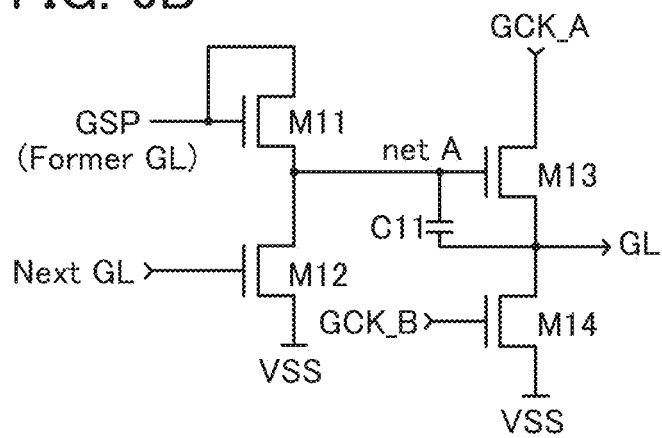
Figure 6C:
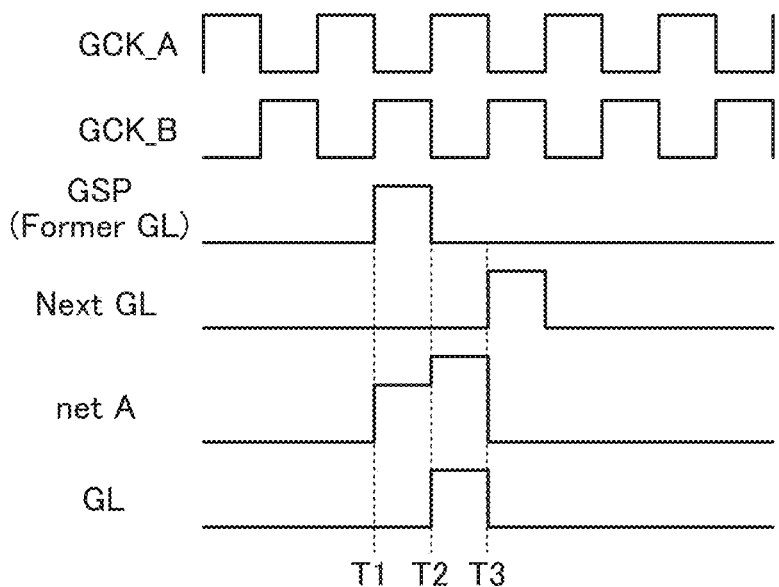

FIGS. 6A to 6C illustrate examples of the driver circuit, the pulse output circuit, and a timing chart.

FIG. 6A is an example of the shift register included in the driver circuit. In FIG. 6A, pulse output circuits SR_1 to SR_n+2, a wiring to supply a gate clock signal GCK_A, a wiring to supply a gate clock signal GCK_B, and a wiring to supply a gate start pulse GSP are shown. A wiring between the pulse output circuits SR_1 and SR_2 is connected to the gate line GL. An output signal from the pulse output circuit SR_n+1 and an output signal from the pulse output circuit SR_n+2 are each a signal for resetting the pulse output circuit in the previous stage.

FIG. 6B is a circuit configuration example of a pulse output circuit SR, which can be used as each of the pulse output circuits SR_1 to SR_n+2 in FIG. 6A. The pulse output circuit SR illustrated in FIG. 6B includes transistors M11 to M14 and a capacitor C11. As signals and a voltage to be supplied to the transistors, FIG. 6B shows the gate clock signal GCK_A, the gate clock signal GCK_B, an output signal GL, the gate start pulse GSP (or an output signal of the previous pulse output circuit SR "Former GL"), an output signal of the next pulse output circuit SR "Next GL", and a voltage VSS. FIG. 6B also shows a node to be connected to the transistors M11, M12, and M13 and the capacitor C11, which is indicated by "net A".

FIG. 6C is a timing chart for describing the operation of the pulse output circuit SR in FIG. 6B. At time T1 in FIG. 6C, GCK_A is at a low level and GCK_B is at a high level, and GSP is set at the high level at this time so as to increase the voltage of "net A". At time T2 that follows, GSP is at the low level, so that "net A" is brought into a floating state. Since GCK_A is at the high level and GCK_B is at the low level at the time T2, the voltage of "net A" in a floating state increases owing to capacitive coupling of the capacitor C11. Thus, the transistor M13 is turned on and GL becomes at the high level. At time T3, "Next GL" becomes at the high level, whereby "net A" becomes at the low level, and GCK_B becomes at the high level, whereby GL becomes at the low level.

<Layered Structure Example of Pixel Circuit and Driver Circuit>

Figure 7:
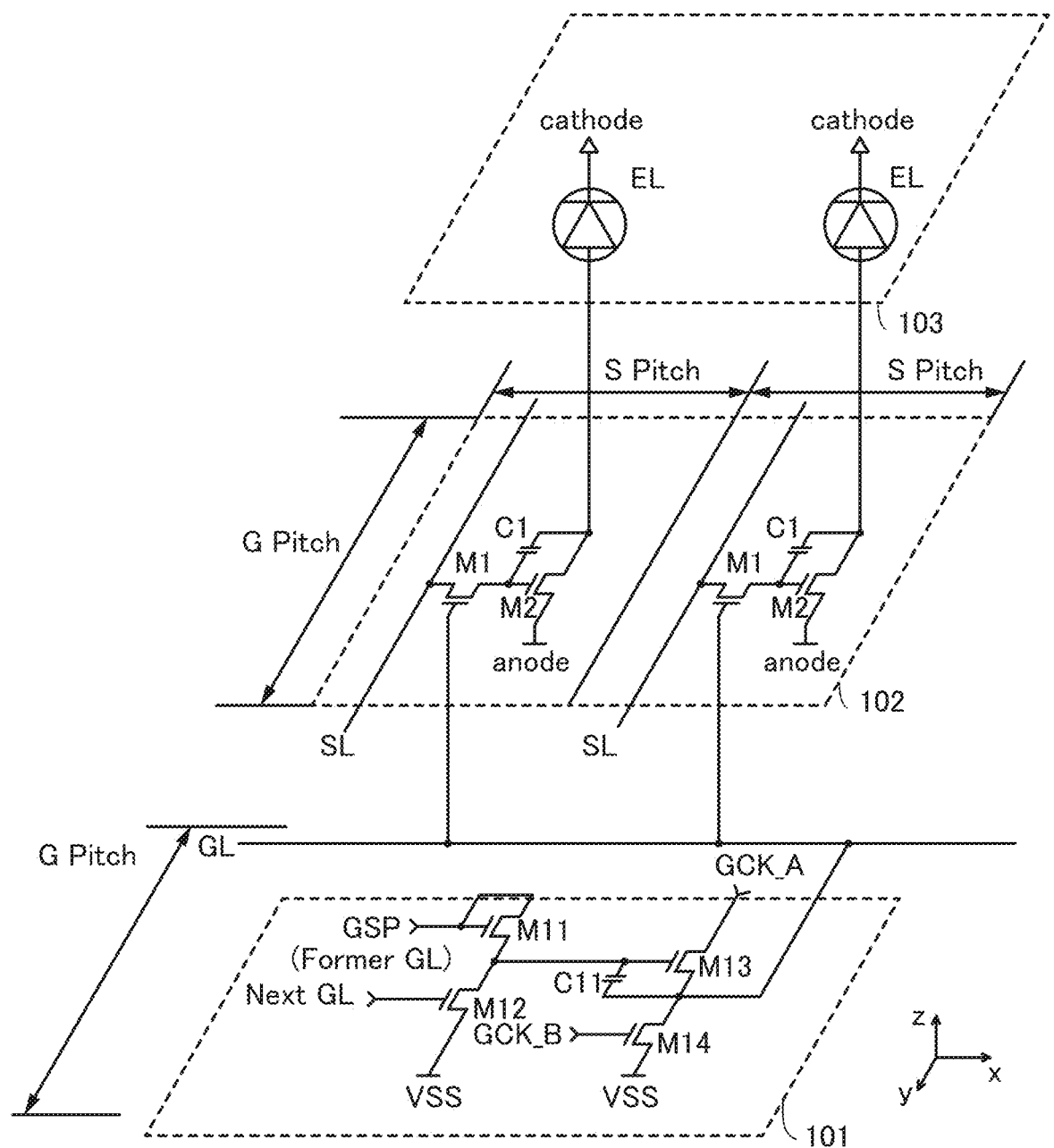
FIG. 7 is a circuit diagram illustrating a display portion.

FIG. 7 illustrates, with use of circuit symbols, a layered structure example in which the pixel circuits in FIG. 5B and the pulse output circuit in FIG. 6B are stacked. Similarly to FIG. 1C, the x direction, the y direction, and the z direction are shown in FIG. 7. The pulse output circuit, the pixel circuits, and light-emitting elements as display elements, which respectively correspond to the layer 101, the layer 102, and the layer 103 described with reference to FIG. 1B, are shown in FIG. 7.

As illustrated in FIG. 7, the pixel circuit in the layer 102 stacked over the layer 101 is provided in every G pitch (a distance between adjacent gate lines GL) in the y direction, and in every S pitch (a distance between adjacent source lines SL) in the x direction. In contrast, intervals in the x direction at which the pulse output circuits in the layer 101 are provided are not restricted, although the pulse output circuit is provided in every G pitch (a distance between adjacent gate lines GL) in the y direction, as illustrated in FIG. 7. Thus, design flexibility in placing the driver circuit including the pulse output circuits can be improved. In addition, since all of the pixel circuits provided in the layer 102 can have the same circuit configuration, the circuit design can be less complicated than in the case where different kinds of circuit configuration are included in a mixed manner.

Figure 8:
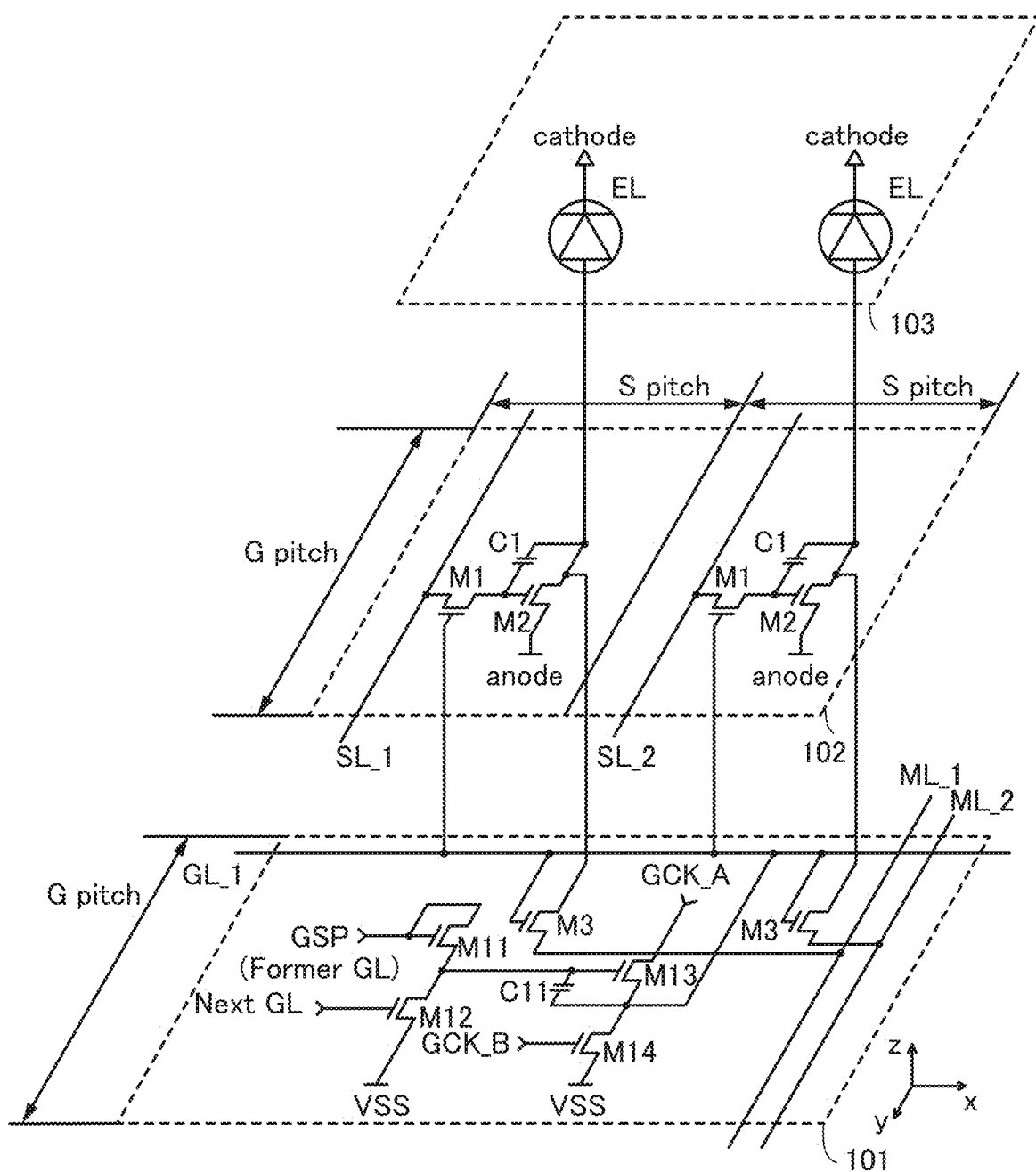
FIG. 8 is a circuit diagram illustrating a display portion.

FIG. 8 illustrates, with use of circuit symbols, a layered structure example in which the pixel circuits in FIG. 5C and the pulse output circuit in FIG. 6B are stacked. Similarly to FIG. 7, the x direction, the y direction, and the z direction are shown in FIG. 8. Similarly to FIG. 7, the pulse output circuit, the pixel circuits, and light-emitting elements as display elements, which respectively correspond to the layer 101, the layer 102, and the layer 103 described with reference to FIG. 1B, are shown in FIG. 8.

FIG. 8 is different from FIG. 7 in that the transistors M3 each constituting the pixel circuit and the monitor lines ML are provided in the layer 101. As described above, according to one embodiment of the present invention, intervals in the x direction at which the pulse output circuits in the layer 101 are provided are not restricted, although the pulse output circuit is provided in every G pitch (a distance between adjacent gate lines GL) in they direction, as illustrated in FIG. 8. Thus, other circuits than the pulse output circuit (e.g., part of the pixel circuit) can also be provided in the layer 101. Since the number of transistors in the layer 102 can be reduced, the area of the pixel circuit can be reduced and a display device with higher resolution can be obtained.

Figure 9A:
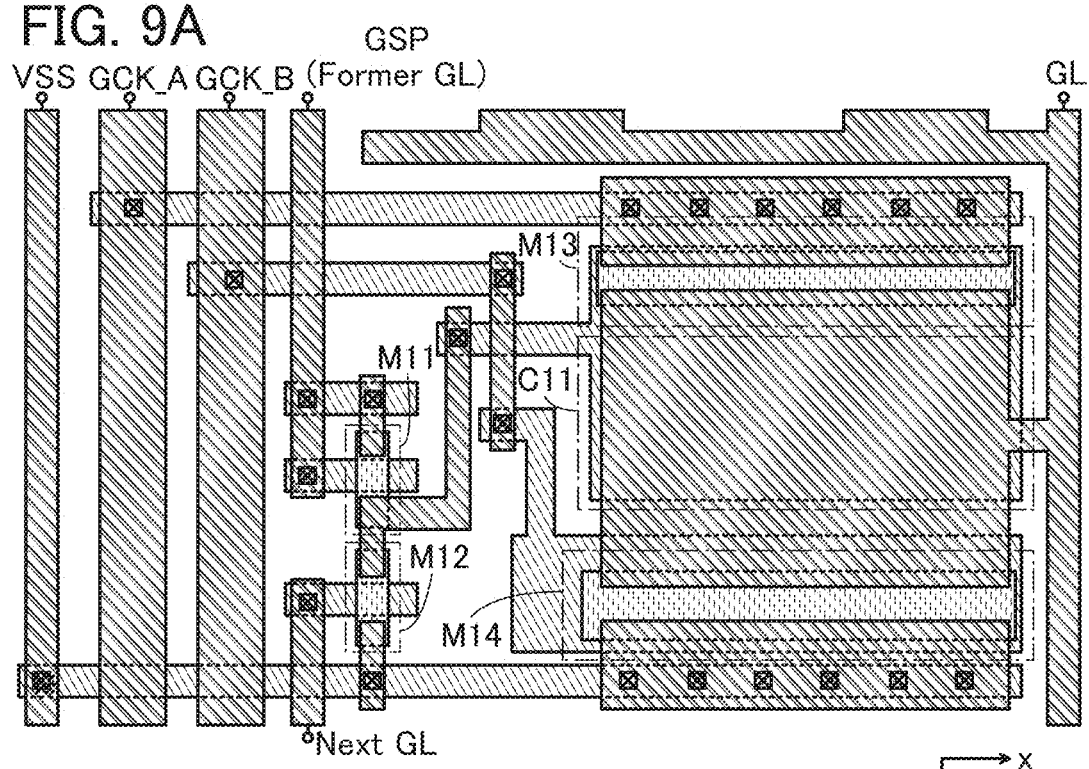
FIGS. 9A and 9B are top views each illustrating a display portion.
Figure 9A:
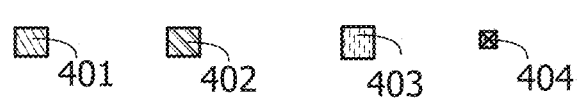
Figure 9B:
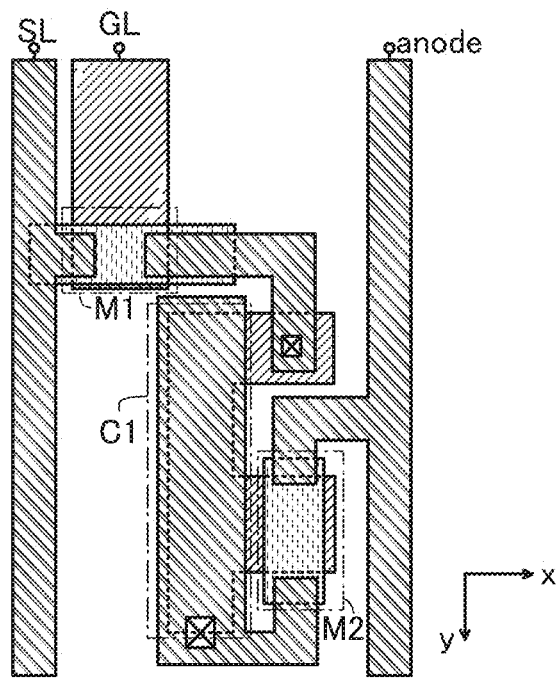
Figure 9B:

FIG. 9A is a top view of the pulse output circuit in FIG. 6B. FIG. 9B is a top view of the pixel circuit in FIG. 5B. Components in FIGS. 9A and 9B that are also included in FIG. 5B and FIG. 6B are indicated by the same reference letters or numerals as those in FIG. 5B and FIG. 6B. The x direction and the y direction shown in FIG. 1C are also shown in FIGS. 9A and 9B.

In FIGS. 9A and 9B, a conductive layer 401 represents a layer provided in the same layer as a gate electrode of the transistor, and a conductive layer 402 represents a layer provided in the same layer as a source or drain electrode of the transistor. In FIGS. 9A and 9B, a semiconductor layer 403 represents a layer provided in the same layer as a semiconductor layer of the transistor. In FIGS. 9A and 9B, an opening 404 represents an opening for connecting the conductive layer 401 and the conductive layer 402. In FIG. 9B, an opening 405 represents an opening for connecting the conductive layer 402 and the light-emitting element EL in the overlying layer 103.

Figure 10:
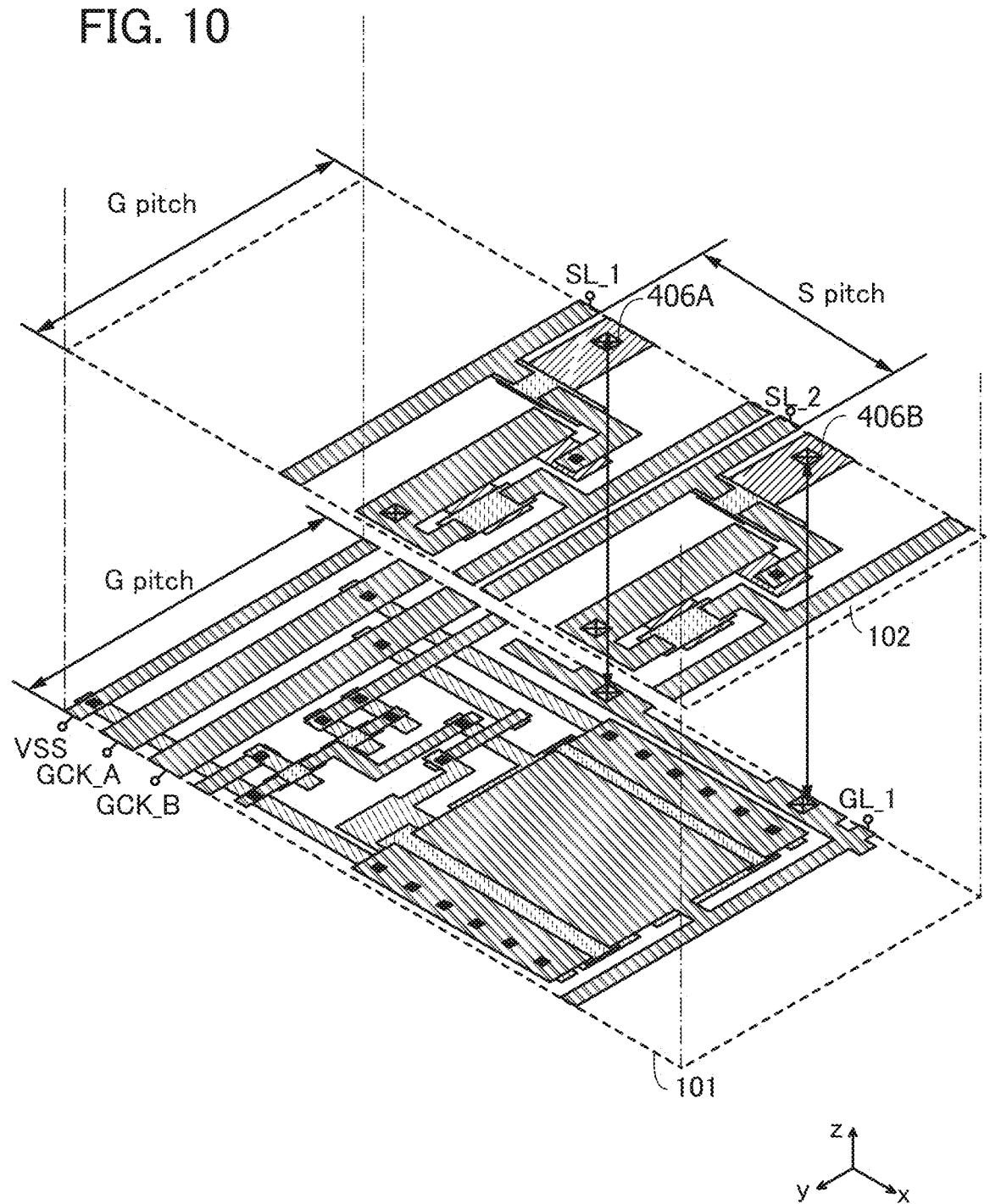
FIG. 10 illustrates a display portion.

FIG. 10 illustrates a state where the layer 102 including the pixel circuit in FIG. 5B, the top view of which is illustrated in FIG. 9B, is stacked over the layer 101 including the pulse output circuit in FIG. 6B, the top view of which is illustrated in FIG. 9A. Components in FIG. 10 that are also included in FIGS. 9A and 9B are indicated by the same reference letters or numerals as those in FIGS. 9A and 9B. The x direction, the y direction, and the z direction shown in FIG. 1C are also shown in FIG. 10.

As illustrated in FIG. 10, the pixel circuits in the layer 102 are connected to the gate line GL in the layer 101 through an opening 406A and an opening 406B. Since the pixel circuit with the opening 406A and the pixel circuit with the opening 406B can have the same circuit design, the connection relation can be prevented from becoming complex in designing. As illustrated in FIG. 10, the elements such as the transistors included in the pixel circuit in the layer 102 are provided to overlap with the elements such as the transistors included in the pulse output circuit in the layer 101.

<Structure Examples of Transistors Provided in Different Layers>

Figure 11:
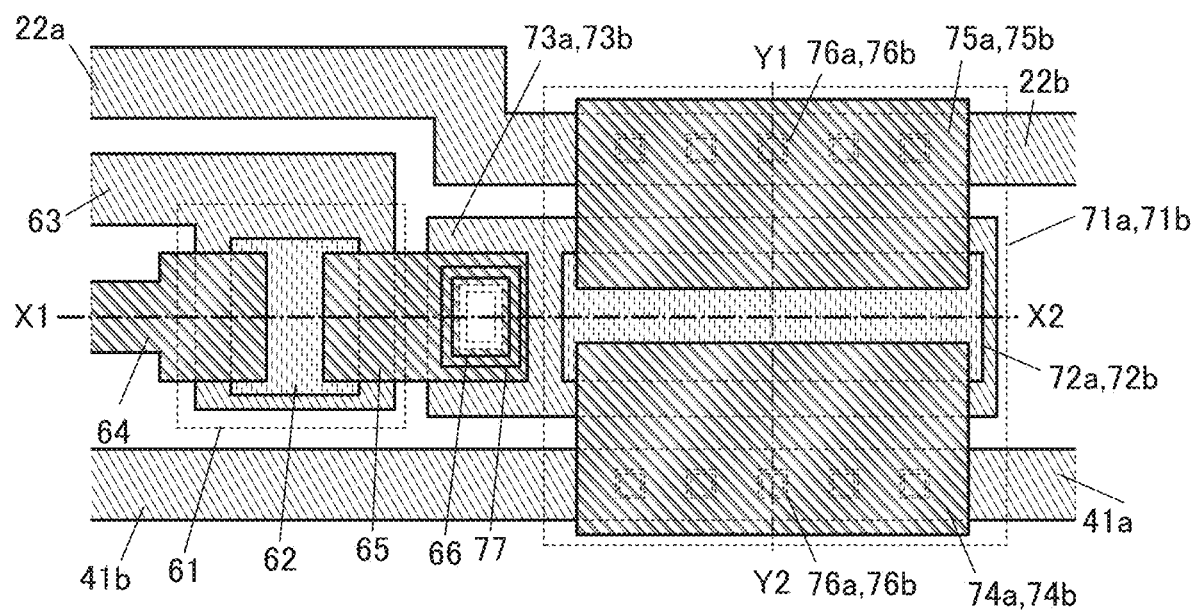
FIG. 11 is a top view illustrating a layered structure.
Figure 12A:
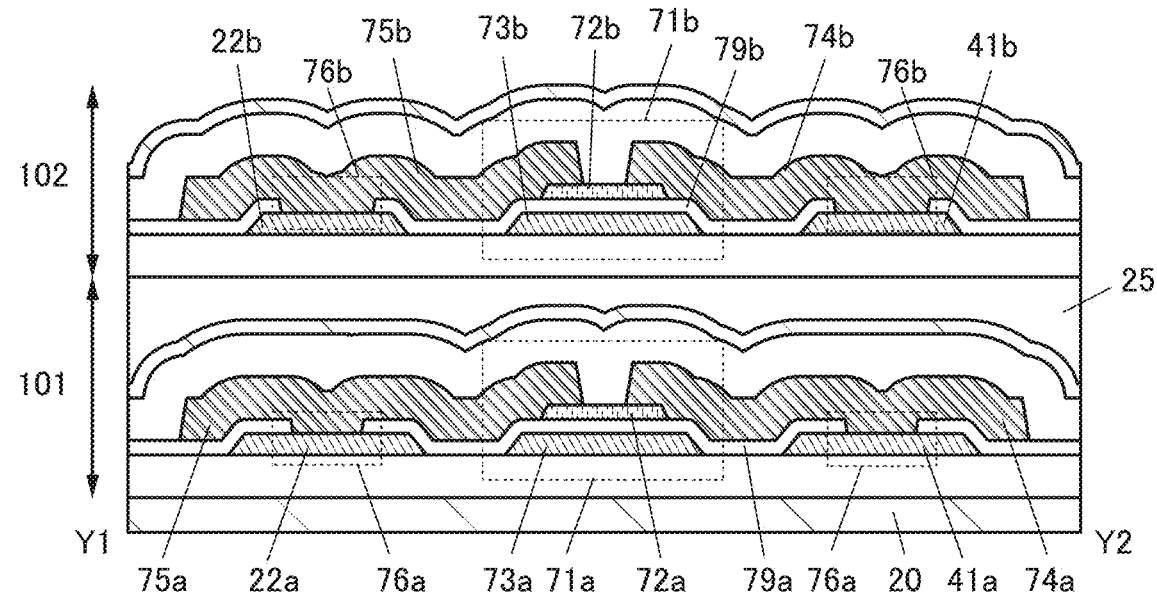
FIGS. 12A and 12B are cross-sectional views each illustrating a layered structure.
Figure 12B:
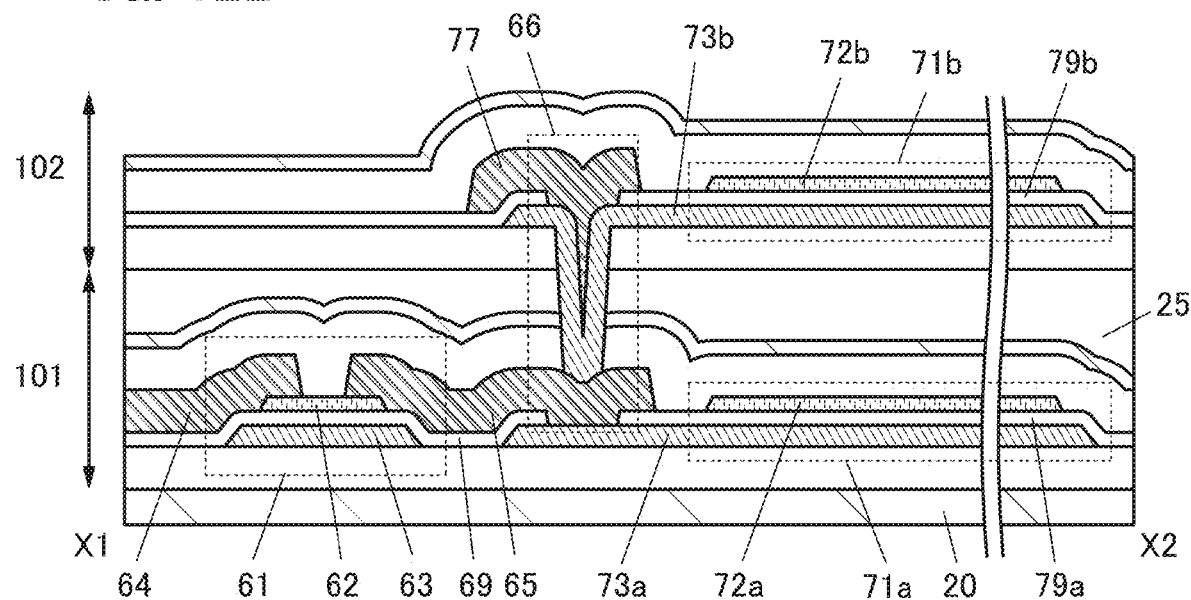

FIG. 11 is an example of a top view for describing a layered structure including the transistors of the driver circuit 91 and the transistor of the pixel circuit 94 provided in different layers. FIG. 12A is a cross-sectional view taken along line Y1-Y2 in FIG. 11, and FIG. 12B is a cross-sectional view taken along line X1-X2 in FIG. 11. Note that some insulating layers and the like are not illustrated or their reference numerals are omitted for simplicity.

Transistors 61 and 71a are shown as the transistors of the driver circuit 91 provided in the layer 101. The transistor 61 includes a gate electrode 63, a gate insulating film 69, a semiconductor layer 62, a source electrode 64, and a drain electrode 65. The transistor 71a includes a gate electrode 73a, a gate insulating film 79a, a semiconductor layer 72a, a source electrode 75a, and a drain electrode 74a.

A transistor 71b is shown as the transistor of the pixel circuit 94 provided in the layer 102. The transistor 71b includes a gate electrode 73b, a gate insulating film 79b, a semiconductor layer 72b, a source electrode 75b, and a drain electrode 74b.

Although the transistor 71a and the transistor 71b have the same size in the drawing, they may differ in size.

Note that each of the transistors is not limited to a bottom-gate transistor but may be a top-gate transistor, or a dual-gate transistor having gate electrodes above and below a semiconductor layer. For a dual-gate transistor, the same potential may be applied to the two gate electrodes, or different potentials such as a potential for controlling a threshold voltage and a potential for increasing an on-state current may be applied to the two electrodes.

Note that a planarization film 25 between the transistors 71a and 71b may be omitted.

The gate electrode 73a of the transistor 71a is electrically connected to the drain electrode 65 of the transistor 61 and the gate electrode 73b of the transistor 71b in a connection portion 66. Here, in FIG. 12B, the connection portion 66 includes a conductive layer 77 that can be provided in the same step as the source electrode 75b and the drain electrode 74b; however, the conductive layer 77 is not necessarily provided.

With use of the above structures, a layer including transistors that constitute pixel circuits and a layer including transistors that constitute a driver circuit can be stacked in a display portion. The transistors that constitute the pixel circuits can be provided in an upper layer, and the transistors that constitute a gate driver, which is the driver circuit, can be provided in a lower layer. Since a restriction on the placement of the driver circuit such as the gate driver is removed, a display device with a narrow bezel can be obtained.

An oxide semiconductor containing a metal oxide is preferably used for a semiconductor layer of a semiconductor device such as the transistors used in the pixel circuit and the driver circuit of the display device. As the oxide semiconductor, for example, a cloud-aligned composite oxide semiconductor (CAC-OS) described later can be used.

In particular, an oxide semiconductor having a wider band gap than silicon is preferably used. When a semiconductor material having a wider band gap and a lower carrier density than silicon is used, the off-state current of the transistor can be reduced.

In addition, charge accumulated in a capacitor through the transistor can be retained for a long time because of the low off-state current of the transistor. The use of such a transistor in pixels allows a driver circuit to stop while the gray level of an image displayed on display portions is maintained. As a result, an electronic device with extremely low power consumption can be obtained.

A polycrystalline semiconductor may also be used for semiconductor devices such as transistors used for the pixels included in the display portions or driver circuits in the display device 11. For example, polycrystalline silicon or the like is preferably used. Polycrystalline silicon can be formed at a lower temperature than single crystal silicon and has higher field effect mobility and higher reliability than amorphous silicon. When such a polycrystalline semiconductor is used for a pixel, the aperture ratio of the pixel can be improved. Even when a very large number of pixels are provided, a gate driver circuit and a source driver circuit can be formed over a substrate where the pixels are formed, so that the number of components of an electronic device can be reduced.

At least part of this embodiment can be implemented in combination with any of the other embodiments described in this specification as appropriate.

Embodiment 2

In this embodiment, a display device that can be used for one embodiment of the present invention and a driving method thereof are described.

The display device of one embodiment of the present invention can include a pixel in which a first display element that reflects visible light is provided, a pixel in which a second display element that emits visible light is provided, a pixel in which a third display element that transmits visible light is provided, or a pixel in which the first display element and one of the second and third display elements are provided.

In this embodiment, a display device including a first display element that reflects visible light and a second display element that emits visible light is described.

The display device has a function of displaying an image utilizing one or both of first light reflected by the first display element and second light emitted from the second display element. Alternatively, the display device has a function of expressing gray scales by individually controlling the amount of first light reflected by the first display element and the amount of second light emitted from the second display element.

It is preferable that the display device have a structure including a first pixel expressing gray scales by controlling the amount of light reflected from the first display element and a second pixel expressing gray scales by controlling the amount of light emitted from the second display element. The first pixels are arranged in a matrix and the second pixels are arranged in a matrix, for example, to form a display portion.

The number of the first pixels is preferably the same as that of the second pixels, and the first pixels and the second pixels are preferably arranged in a display portion with the same pitch. Accordingly, as described later, an image displayed by a plurality of first pixels, an image displayed by a plurality of second pixels, and an image displayed by both the plurality of first pixels and the plurality of second pixels can be displayed in the same display portion.

As the first display element included in the first pixel, an element that performs display by reflecting external light can be used. Such an element does not include a light source and thus power consumption in display can be significantly reduced.

As the first display element, a reflective liquid crystal element can be typically used. As the first display element, other than a Micro Electro Mechanical Systems (MEMS) shutter element and an optical interference type MEMS element, an element using a microcapsule method, an electrophoretic method, an electrowetting method, an Electronic Liquid Powder (registered trademark) method, or the like can be used.

As the second display element included in the second pixel, an element including a light source and performing display using light from the light source can be used. Specifically, it is preferable to use an electroluminescence element in which light can be extracted from a light-emitting substance by application of an electric field. Since the luminance and the chromaticity of light emitted from such a pixel are not affected by external light, an image with high color reproducibility (a wide color gamut) and a high contrast, i.e., a clear image can be displayed.

As the second display element, a self-luminous light-emitting element such as an organic light-emitting diode (OLED), a light-emitting diode (LED), a quantum-dot light-emitting diode (QLED), and a semiconductor laser can be used. Alternatively, a combination of a backlight that serves as a light source and a transmissive liquid crystal element that controls the amount of light from the backlight transmitted therethrough may be used as the display element included in the second pixel.

The first pixel can include, for example, a subpixel exhibiting light of white (W), or subpixels exhibiting light of three colors of red (R), green (G), and blue (B). Similarly, the second pixel can include, for example, a subpixel exhibiting light of white (W), or subpixels exhibiting light of three colors of red (R), green (G), and blue (B). Note that the first pixel and the second pixel may each include subpixels of four colors or more. As the number of subpixels is increased, power consumption can be reduced and color reproducibility can be improved.

In one embodiment of the present invention, a first mode in which an image is displayed by the first pixels, a second mode in which an image is displayed by the second pixels, and a third mode in which an image is displayed by the first pixels and the second pixels can be switched.

The first mode is a mode in which an image is displayed utilizing light reflected from the first display element. In the first mode, a light source is not necessary and thus the first mode is a driving mode with extremely low power consumption. The first mode is effective in the case where, for example, external light has a sufficiently high illuminance and is white light or light near white light. The first mode is a display mode appropriate for displaying text data, such as that of a book or that of a document. Use of reflected light enables eye-friendly display, thereby mitigating eye strain fatigue.

The second mode is a mode in which an image is displayed utilizing light emitted from the second display element. Thus, an extremely clear image (with high contrast and high color reproducibility) can be displayed regardless of the illuminance and chromaticity of external light. The second mode is effective in the case where the illuminance of external light is extremely low, such as during the night or in a dark room, for example. When a bright image is displayed under weak external light, a user may feel that the image is too bright. To prevent this, an image with reduced luminance is preferably displayed in the second mode. Thus, not only a reduction in the luminance but also low power consumption can be achieved. The second mode is a mode suitable for obtaining a clear image and a smooth moving image.

The third mode is a mode in which display is performed using both light reflected from the first display element and light emitted from the second display element. Specifically, the display device is driven so that light emitted from the first pixel and light emitted from the second pixel adjacent to the first pixel are mixed to express one color. Accordingly, a clearer image than that in the first mode can be displayed and power consumption can be made lower than that in the second mode. For example, the third mode is effective when the illuminance of external light is relatively low such as under indoor illumination or in the morning or evening, or when the external light does not represent a white chromaticity. Furthermore, the use of light obtained by mixing reflected light and emitted light makes it possible to display an image that gives a viewer the impression of seeing a picture.

A more specific example of one embodiment of the present invention is described below with reference to drawings.

[Structure Example of Display Device]

Figure 13A:
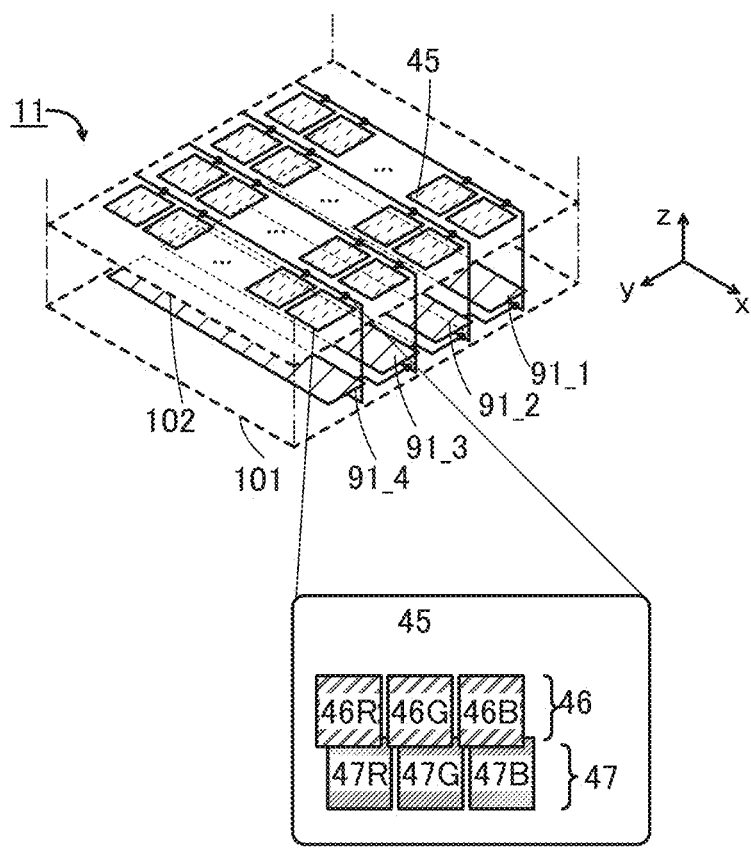
FIGS. 13A to 13C illustrate a structure of a display device.

FIG. 13A illustrates a display device 11 of one embodiment of the present invention. The display device 11 includes a layer 102 including transistors and a layer 101 including transistors. The display device 11 may also include a photometric portion for obtaining illuminance of external light and the like. Note that, in the following description, a combination of a pixel circuit and a display element is referred to as a pixel.

The layer 102 includes a plurality of pixels 45 arranged in a matrix. The pixel 45 includes a first pixel 46 and a second pixel 47. The layer 101 includes pulse output circuits 91_1 to 91_4.

FIG. 13A shows an example where the first pixel 46 and the second pixel 47 each include display elements corresponding to three colors of red (R), green (G), and blue (B).

The first pixel 46 includes a display element 46R corresponding to red (R), a display element 46G corresponding to green (G), and a display element 46B corresponding to blue (B). The display elements 46R, 46G, and 46B each utilize reflection of external light.

The second pixel 47 includes a display element 47R corresponding to red (R), a display element 47G corresponding to green (G), and a display element 47B corresponding to blue (B). The display elements 47R, 47G, and 47B each utilize light of a light source.

Figure 13B:
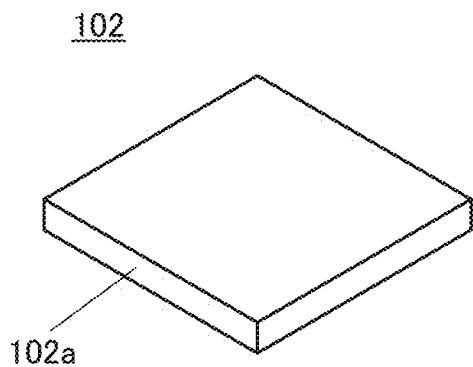

As illustrated in FIG. 13B, the layer 102 in which the pixels 45 are provided can be a layer 102*a* including transistors. Alternatively, as illustrated in FIG. 13C, the layer 102 in which the pixels 45 are provided can be a stack of the layer 102*a* including transistors and a layer 102*b* including transistors.

Figure 13C:
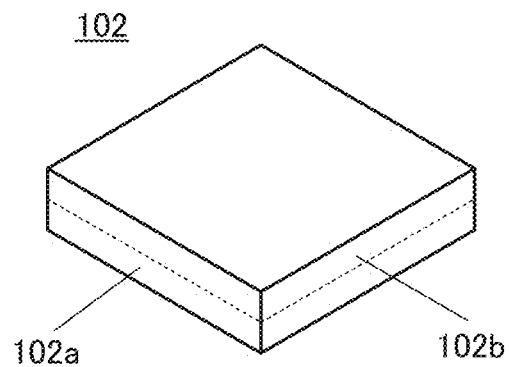

In FIG. 13C, one of the first pixel 46 and the second pixel 47 can be provided in the layer 102*a*, and the other can be provided in the layer 102*b*. In that case, a transistor (first transistor) included in the first pixel 46 can be provided in the layer 102*a*, and a transistor (second transistor) included in the second pixel 47 can be provided in the layer 102*b*. The first transistor and the second transistor can overlap with each other. With such a structure, the area occupied by the transistors can be reduced, whereby the pixel density can be easily increased.

That is the description of the structure examples of the display device.

[Configuration Example of Pixel]

Figure 14A:
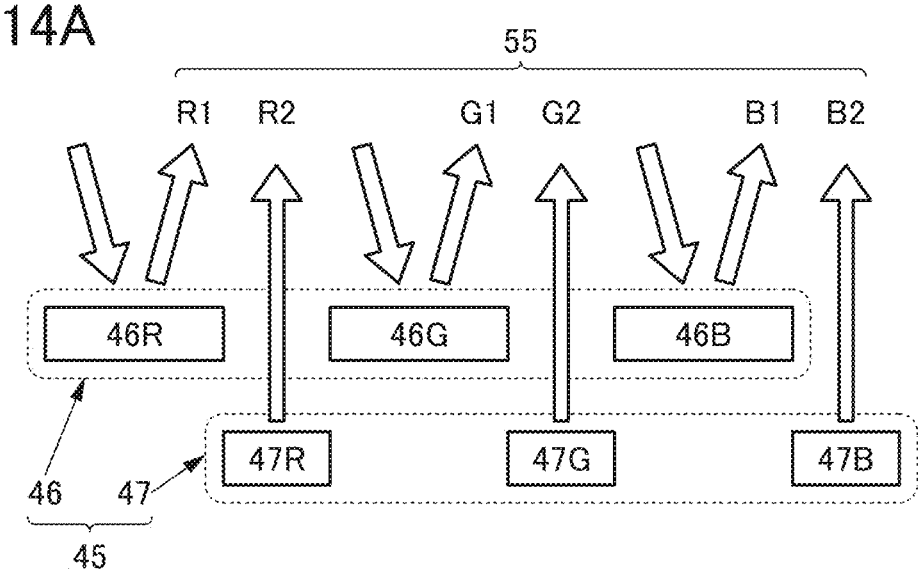
FIGS. 14A to 14C each illustrate a pixel.
Figure 14B:
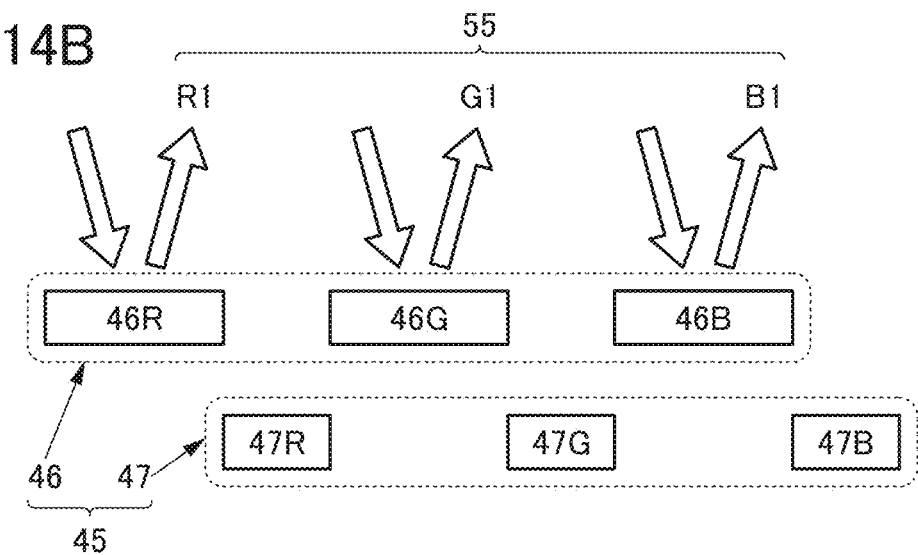
Figure 14C:
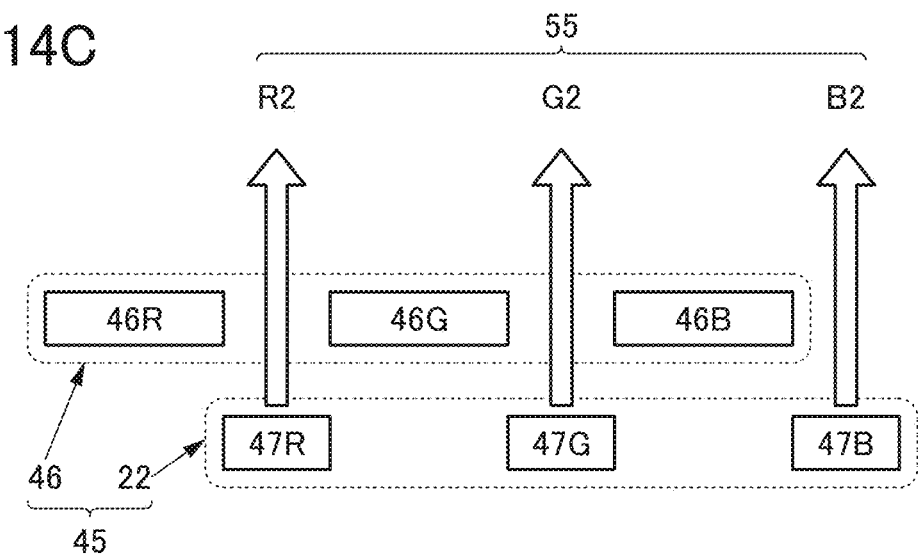

Next, the pixel 45 is described with reference to FIGS. 14A to 14C. FIGS. 14A to 14C are schematic views illustrating configuration examples of the pixel 45.

The first pixel 46 includes the display elements 46R, 46G, and 46B. The display element 46R reflects external light and emits, to the display surface side, red light R1 with a luminance corresponding to a gray level of red included in the first gray level input to the first pixel 46. Similarly, the display element 46G and the display element 46B emit green light G1 and blue light B1, respectively, to the display surface side.

The second pixel 47 includes the display elements 47R, 47G, and 47B. The display element 47R includes a light source and emits, to the display surface side, red light R2 with a luminance corresponding to a gray level of red included in the second gray level input to the second pixel 47. Similarly, the display element 47G and the display element 47B emit green light G2 and blue light B2, respectively, to the display surface side.

[Third Mode]

FIG. 14A shows an example of an operation mode in which an image is displayed by driving both the display elements reflecting external light (the display elements 46R, 46G, and 46B) and the display elements emitting light (the display elements 47R, 47G, and 47B). As illustrated in FIG. 14A, the pixel 45 can emit light 55 of a predetermined color to the display surface side by mixing light of six colors, the light R1, the light G1, the light B1, the light R2, the light G2, and the light B2.

At that time, the luminance of each of the display elements 47R, 47G, and 47B is preferably low. For example, when the maximum value of luminance of light that can be emitted by each of the display elements 47R, 47G, and 47B (which is also referred to as highest luminance) is 100%, the maximum value of luminance of light actually emitted by each of the display elements 47R, 47G, and 47B in the third mode is preferably 5% to 50% inclusive, further preferably 1% to 60% inclusive, of the highest luminance. Thus, an image can be displayed with low power consumption, the displayed image can be more picturesque, and display can be easy on eyes.

[First Mode]

FIG. 14B shows an example of an operation mode in which an image is displayed by driving the display elements 46R, 46G, and 46B that reflect external light. As illustrated in FIG. 14B, in the case where the illuminance of external light is sufficiently high, for example, the pixel 45 can emit the light 55 of a predetermined color by mixing only light from the first pixel 46 (the light R1, the light G1, and the light B1) without driving the second pixel 47. Thus, driving with extremely low power consumption can be performed.

[Second Mode]

FIG. 14C shows an example of an operation mode in which an image is displayed by driving the display elements 47R, 47G, and 47B. As illustrated in FIG. 14C, in the case where the illuminance of external light is extremely low, for example, the pixel 45 can emit the light 55 of a predetermined color by mixing only light from the second pixel 47 (the light R2, the light G2, and the light B2) without driving the first pixel 46. Accordingly, a clear image can be displayed. Furthermore, luminance is lowered when the illuminance of external light is low, which can prevent a user from feeling glare and reduce power consumption.

In this mode, the luminance of the display elements that emit visible light is preferably higher than that in the third mode. For example, the maximum value of luminance of light emitted by each of the display elements 47R, 47G, and 47B in the second mode can be 100% of the highest luminance, or 50% to 100% inclusive, preferably 60% to 100% inclusive, of the highest luminance. Accordingly, a clear image can be displayed even at a bright place with external light.

Here, each of the maximum values of luminance of light emitted by the display elements 47R, 47G, and 47B can be expressed by a dynamic range. That is, the dynamic range of each of the display elements 47R, 47G, and 47B in the third mode can be set narrower than that in the second mode. For example, the dynamic range of the display element 47R, 47G, or 47B in the third mode can be set to 5% to 50% inclusive, preferably 1% to 60% inclusive, of the dynamic range thereof in the second mode.

The above is the description of the configuration examples of the pixel 45.

At least part of this embodiment can be implemented in combination with any of the other embodiments described in this specification as appropriate.

Embodiment 3

An example of a display panel that can be used for the display device of one embodiment of the present invention is described below. The display panel described below as an example includes both a reflective liquid crystal element and a light-emitting element and can display an image both in a transmissive mode and in a reflective mode.

[Structure Example]

Figure 15A:
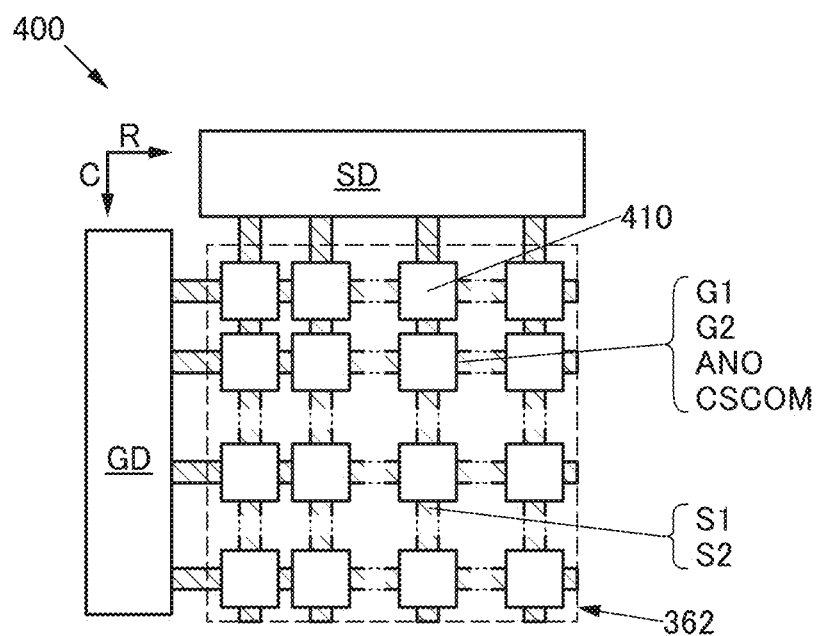
Figure 15A:
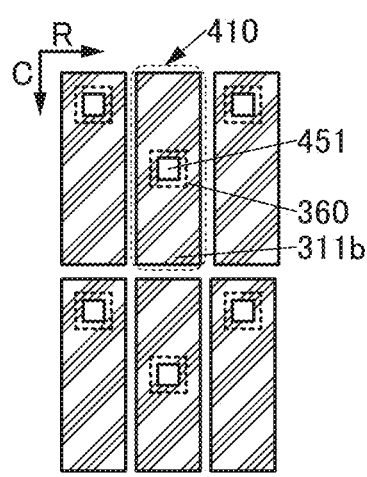
Figure 15A:
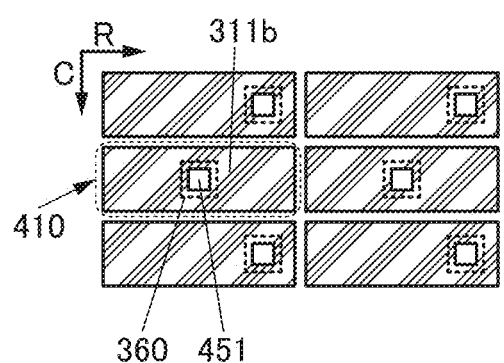

FIG. 15A is a block diagram illustrating an example of the structure of a display device 400. The display device 400 includes a plurality of pixels 410 that are arranged in a matrix in a display portion 362. The display device 400 also includes a circuit GD and a circuit SD. In addition, the display device 400 includes a plurality of wirings G1, a plurality of wirings G2, a plurality of wirings ANO, and a plurality of wirings CSCOM, which are electrically connected to the circuit GD and the pixels 410 arranged in a direction R. Moreover, the display device 400 includes a plurality of wirings S1 and a plurality of wirings S2 that are electrically connected to the circuit SD and the pixels 410 arranged in a direction C.

Although the display device includes one circuit GD and one circuit SD here for simplification, a circuit GD and a circuit SD for driving a liquid crystal element and another circuit GD and another circuit SD for driving a light-emitting element may be provided.

The pixel 410 includes a reflective liquid crystal element and a light-emitting element. In the pixel 410, the liquid crystal element and the light-emitting element overlap with each other.

FIG. 15B1 illustrates a structure example of a conductive layer 311b included in the pixel 410. The conductive layer 311b serves as a reflective electrode of the liquid crystal element in the pixel 410. The conductive layer 311b has an opening 451.

In FIG. 15B1, a light-emitting element 360 in a region overlapping with the conductive layer 311b is denoted by a dashed line. The light-emitting element 360 is placed to overlap with the opening 451 included in the conductive layer 311b. Thus, light from the light-emitting element 360 is emitted to a display surface side through the opening 451.

In FIG. 15B1, the pixels 410 adjacent to each other in the direction R correspond to pixels emitting different colors. As illustrated in FIG. 15B1, the openings 451 are preferably provided in different positions in the conductive layers 311b so as not to be aligned in the two pixels adjacent to each other in the direction R. This allows the two light-emitting elements 360 to be apart from each other, thereby preventing light emitted from the light-emitting element 360 from entering a coloring layer in the adjacent pixel 410 (such a phenomenon is also referred to as crosstalk). Furthermore, since the two adjacent light-emitting elements 360 can be placed apart from each other, a high-resolution display device is achieved even when EL layers of the light-emitting elements 360 are separately formed with a shadow mask or the like.

Alternatively, the pixels 410 may be arranged in a manner illustrated in FIG. 15B2.

If the ratio of the total area of the opening 451 to the total area except for the opening is too large, display performed using the liquid crystal element is dark. If the ratio of the total area of the opening 451 to the total area except for the opening is too small, display performed using the light-emitting element 360 is dark.

If the area of the opening 451 in the conductive layer 311b serving as a reflective electrode is too small, light emitted from the light-emitting element 360 is not efficiently extracted.

The opening 451 may have a polygonal shape, a quadrangular shape, an elliptical shape, a circular shape, a cross-like shape, a stripe shape, a slit-like shape, or a checkered pattern, for example. The opening 451 may be placed close to the adjacent pixel. Preferably, the opening 451 is placed close to another pixel emitting light of the same color, in which case crosstalk can be suppressed.

[Circuit Configuration Example]

Figure 16:
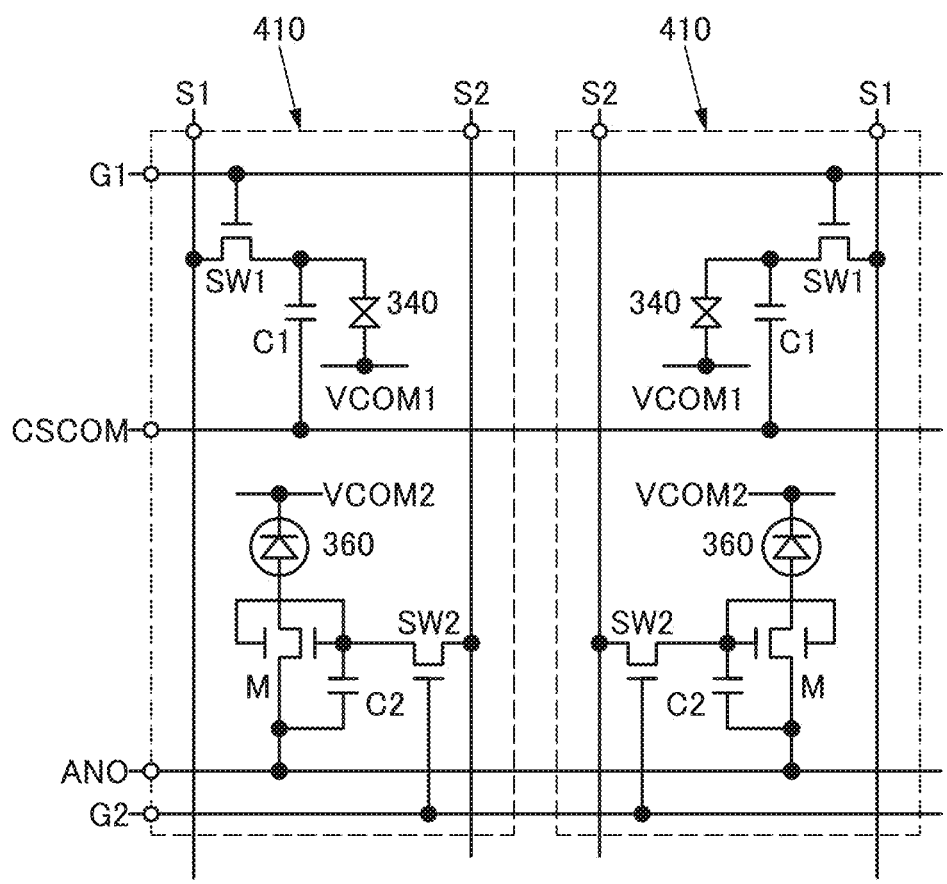
FIG. 16 illustrates pixel circuits.

FIG. 16 is a circuit diagram illustrating a structure example of the pixel 410. FIG. 16 shows two adjacent pixels 410.

The pixel 410 includes a switch SW1, a capacitor C1, a liquid crystal element 340, a switch SW2, a transistor M, a capacitor C2, the light-emitting element 360, and the like. The pixel 410 is electrically connected to the wiring G1, the wiring G2, the wiring ANO, the wiring CSCOM, the wiring S1, and the wiring S2. FIG. 16 illustrates a wiring VCOM1 electrically connected to the liquid crystal element 340 and a wiring VCOM2 electrically connected to the light-emitting element 360.

FIG. 16 illustrates an example in which a transistor is used as each of the switches SW1 and SW2.

A gate of the switch SW1 is connected to the wiring G1. One of a source and a drain of the switch SW1 is connected to the wiring S1, and the other of the source and the drain is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 360. The other electrode of the light-emitting element 360 is connected to the wiring VCOM2.

FIG. 16 illustrates an example in which the transistor M includes two gates between which a semiconductor is provided and which are connected to each other. This structure can increase the amount of current flowing through the transistor M.

The wiring G1 can be supplied with a signal for changing the on/off state of the switch SW1. A predetermined potential can be supplied to the wiring VCOM1. The wiring S1 can be supplied with a signal for changing the orientation of liquid crystals of the liquid crystal element 340. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the conduction state of the transistor M.

In the pixel 410 of FIG. 16, for example, an image can be displayed in the reflective mode by driving the pixel with the signals supplied to the wiring G1 and the wiring S1 and utilizing the optical modulation of the liquid crystal element 340. In the case where an image is displayed in the transmissive mode, the pixel is driven with the signals supplied to the wiring G2 and the wiring S2 and the light-emitting element 360 emits light. In the case where both modes are performed at the same time, the pixel can be driven with the signals to the wiring G1, the wiring G2, the wiring S1, and the wiring S2.

Figure 17A:
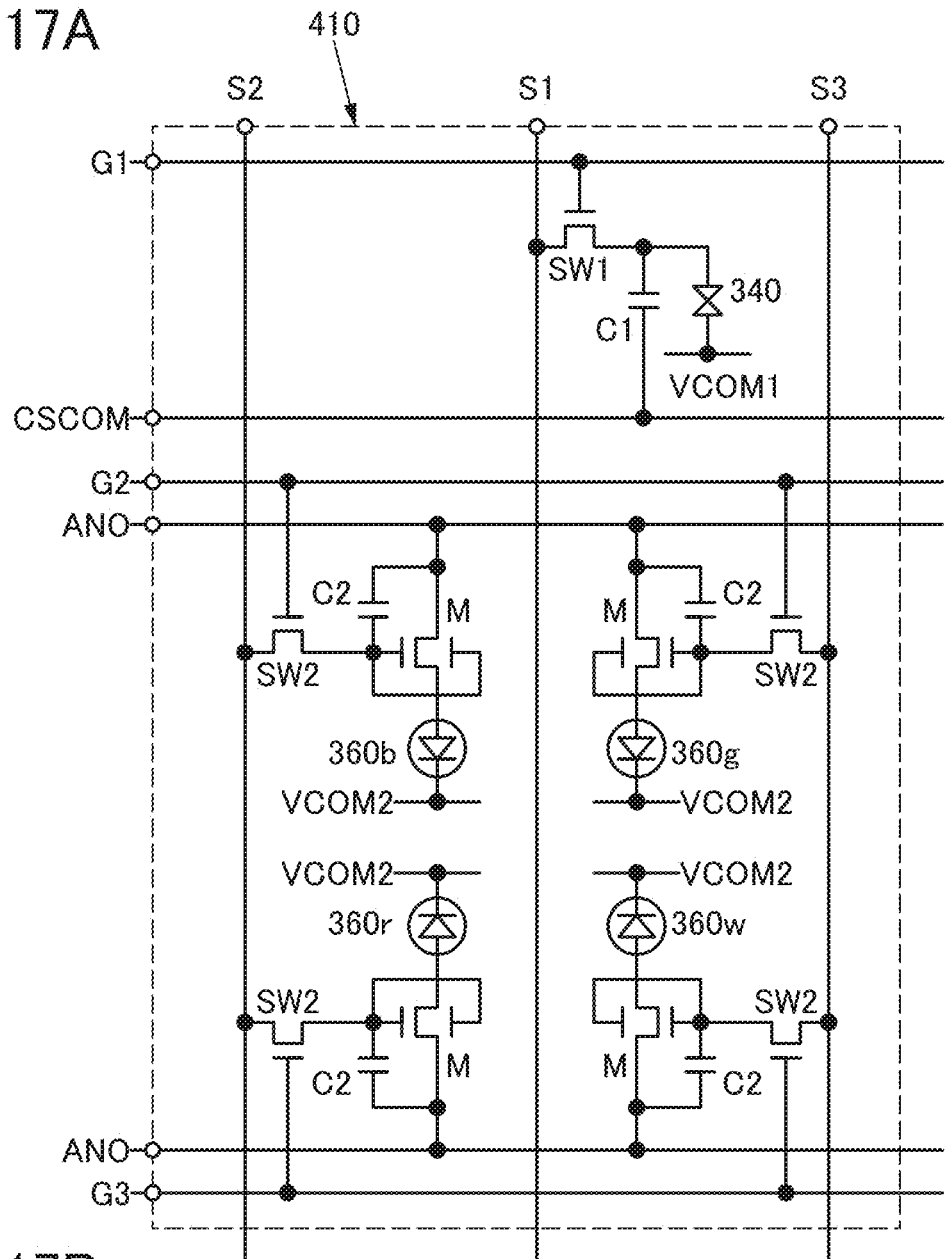
FIGS. 17A and 17B are a drawing illustrating a pixel circuit and a top view of a pixel.

Although FIG. 16 illustrates an example in which one liquid crystal element 340 and one light-emitting element 360 are provided in one pixel 410, one embodiment of the present invention is not limited thereto. FIG. 17A illustrates an example in which one liquid crystal element 340 and four light-emitting elements 360 (light-emitting elements 360r, 360g, 360b, and 360w) are provided in one pixel 410.

In FIG. 17A, in addition to the example in FIG. 16, a wiring G3 and a wiring S3 are connected to the pixel 410.

In the example in FIG. 17A, light-emitting elements emitting red light (R), green light (G), blue light (B), and white light (W) can be used for the four light-emitting elements 360, for example. As the liquid crystal element 340, a reflective liquid crystal element emitting white light can be used. Thus, for display in the reflective mode, white display with high reflectivity can be performed. For display in the transmissive mode, images can be displayed with a higher color rendering property at low power consumption.

Figure 17B:
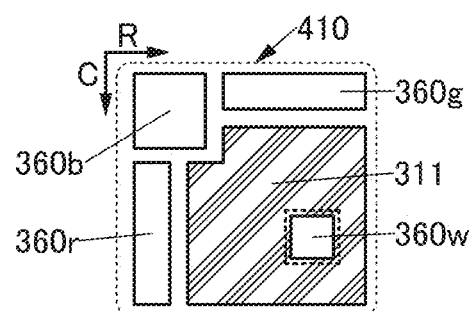

FIG. 17B illustrates a structural example of the pixel 410. The pixel 410 includes the light-emitting element 360w overlapping with the opening of an electrode 311, the light-emitting elements 360r, 360g, and 360b arranged in the periphery of the electrode 311. It is preferable that the light-emitting elements 360r, 360g, and 360b have almost the same light-emitting area.

[Structure Example of Display Panel]

Figure 18:
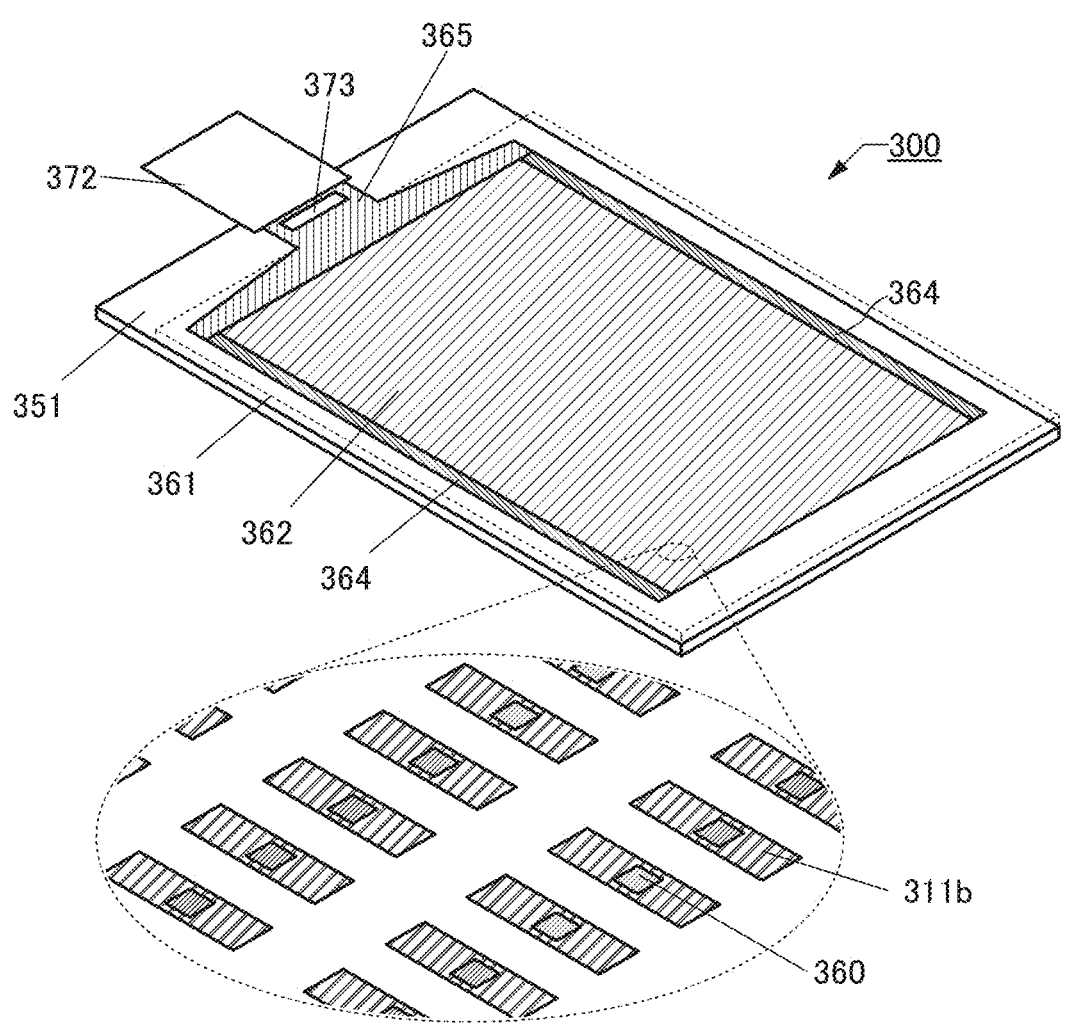
FIG. 18 illustrates a structure of a display device.

FIG. 18 is a schematic perspective view illustrating a display panel 300 of one embodiment of the present invention. In the display panel 300, a substrate 351 and a substrate 361 are attached to each other. In FIG. 18, the substrate 361 is denoted by a dashed line.

A display panel 300 includes the display portion 362, a circuit 364, a wiring 365, and the like. The substrate 351 is provided with the circuit 364, the wiring 365, the conductive layer 311b that serves as a pixel electrode, and the like. In FIG. 18, an IC 373 and an FPC 372 are mounted on the substrate 351. Thus, the structure illustrated in FIG. 18 can be referred to as a display module including the display panel 300, the FPC 372, and the IC 373.

As the circuit 364, for example, a circuit functioning as a scan line driver circuit can be used.

The wiring 365 has a function of supplying a signal or electric power to the display portion or the circuit 364. The signal or electric power is input to the wiring 365 from the outside through the FPC 372 or from the IC 373.

FIG. 18 shows an example in which the IC 373 is provided on the substrate 351 by a chip on glass (COG) method or the like. As the IC 373, an IC functioning as a scan line driver circuit, a signal line driver circuit, or the like can be used. Note that the IC 373 may be omitted in the case where the display panel 300 includes circuits serving as a scan line driver circuit and a signal line driver circuit or in the case where the circuits serving as a scan line driver circuit and a signal line driver circuit are provided outside and a signal for driving the display panel 300 is input through the FPC 372, for example. Alternatively, the IC 373 may be mounted on the FPC 372 by a chip on film (COF) method or the like.

FIG. 18 also shows an enlarged view of part of the display portion 362. The conductive layers 311b included in a plurality of display elements are arranged in a matrix in the display portion 362. The conductive layer 311b has a function of reflecting visible light and serves as a reflective electrode of the liquid crystal element 340 described later.

As illustrated in FIG. 18, the conductive layer 311b has an opening. The light-emitting element 360 is provided on the substrate 351 side of the conductive layer 311b. Light is emitted from the light-emitting element 360 to the substrate 361 side through the opening in the conductive layer 311b.

[Cross-Sectional Structure Example]

Figure 19:
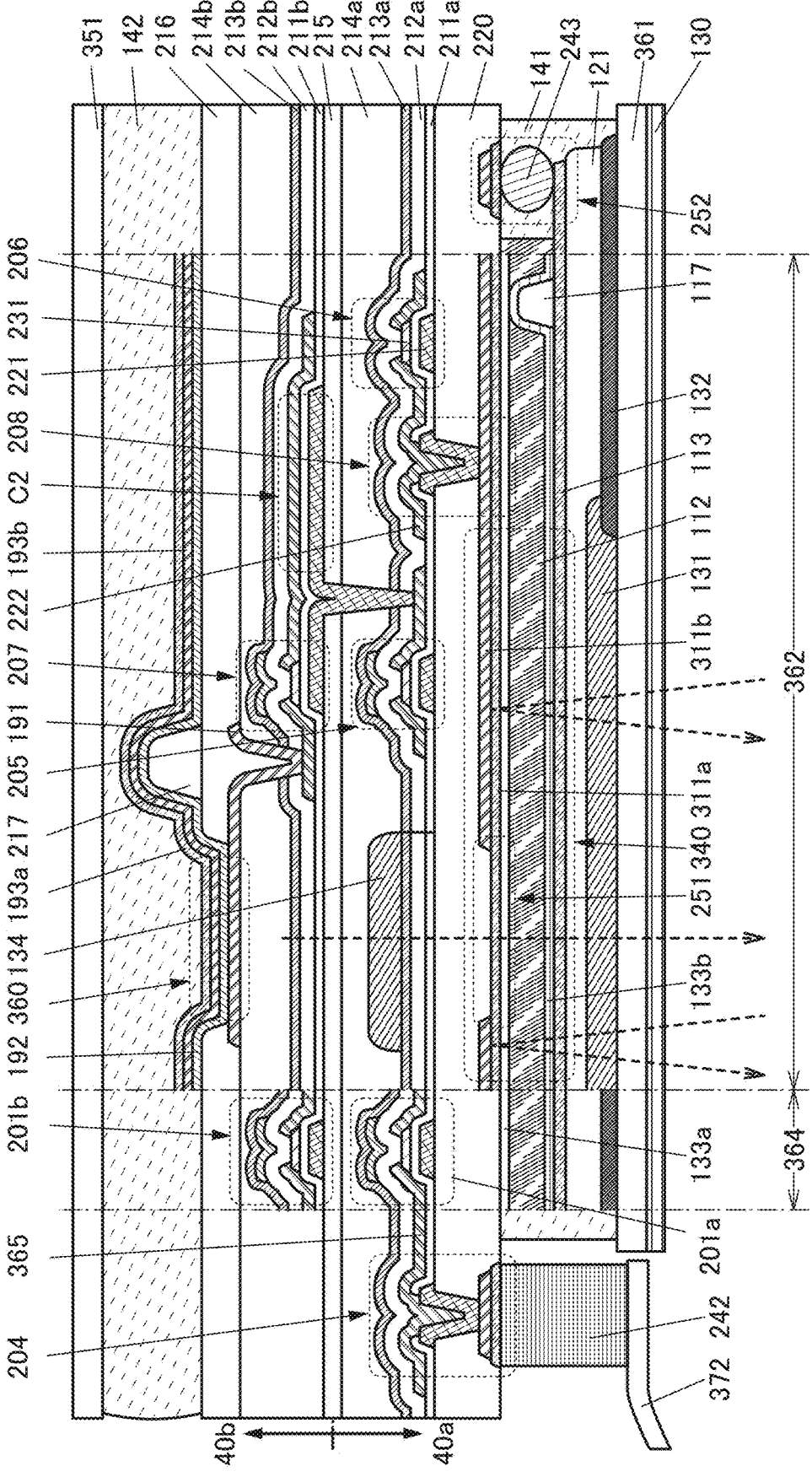
FIG. 19 is a cross-sectional view illustrating a structure of a display device.

FIG. 19 shows an example of cross sections of part of a region including the FPC 372, part of a region including the circuit 364, and part of a region including the display portion 362 of the display panel illustrated in FIG. 18.

The display panel includes an insulating layer 220 between the substrates 351 and 361. The display panel also includes the light-emitting element 360, a transistor 201a, a transistor 201b, a transistor 205, a transistor 206, a transistor 207, a coloring layer 134, and the like between the substrate 351 and the insulating layer 220. Furthermore, the display panel includes the liquid crystal element 340, a coloring layer 131, and the like between the insulating layer 220 and the substrate 361. The substrate 361 and the insulating layer 220 are bonded with an adhesive layer 141. The substrate 351 and the insulating layer 220 are bonded with an adhesive layer 142.

The transistor 206 is electrically connected to the liquid crystal element 340. The transistor 205 is electrically connected to the transistor 207. The transistor 207 is electrically connected to the light-emitting element 360. Since the transistors 205 and 206 are formed on a surface of the insulating layer 220 that is on the substrate 351 side, the transistors 205 and 206 can be formed through the same process. Furthermore, since the transistor 207 is formed to overlap with the transistor 205, the pixel size can be reduced. Note that a region of an extending gate electrode of the transistor 207, a region of an extending gate insulating film of the transistor 207, and a region of an extending source or drain electrode of the transistor 207 can form the capacitor C2.

The coloring layer 131, a light-blocking layer 132, an insulating layer 121, a conductive layer 113 serving as a common electrode of the liquid crystal element 340, an alignment film 133b, an insulating layer 117, and the like are provided over the substrate 361. The insulating layer 117 serves as a spacer for holding a cell gap of the liquid crystal element 340.

Insulating layers such as an insulating layer 211a, an insulating layer 212a, an insulating layer 213a, an insulating layer 214a, an insulating layer 215, an insulating layer 211b, an insulating layer 212b, an insulating layer 213b, an insulating layer 214b, and an insulating layer 216 are provided on the substrate 351 side of the insulating layer 220.

Parts of the insulating layer 211a function as gate insulating layers of the transistors 205 and 206. The insulating layer 212a, the insulating layer 213a, and the insulating layer 214a are provided to cover the transistors 205 and 206.

Part of the insulating layer 211b functions as a gate insulating layer of the transistor 207. The insulating layer 212b, the insulating layer 213b, and the insulating layer 214b are provided to cover the transistor 207.

The insulating layers 214a and 214b each have a function of a planarization layer. Note that an example where the three insulating layers are provided to cover the transistors and the like is described here; however, one embodiment of the present invention is not limited to this example, and four or more insulating layers, a single insulating layer, or two insulating layers may be provided. The insulating layers 214a and 214b serving as planarization layers are not necessarily provided. Furthermore, an example where the insulating layer 215 is provided between the insulating layers 214a and 211b is described here; however, the insulating layer 215 is not necessarily provided.

The transistors 205, 206, and 207 each include a conductive layer 221 part of which functions as a gate, conductive layers 222 part of which functions as a source or a drain, and a semiconductor layer 231.

The liquid crystal element 340 is a reflective liquid crystal element. The liquid crystal element 340 has a structure in which a conductive layer 311a, a liquid crystal 112, and the conductive layer 113 are stacked. The conductive layer 311b that reflects visible light is provided in contact with the substrate 351 side of the conductive layer 311a. The conductive layer 311b includes an opening 251. The conductive layers 311a and 113 contain a material transmitting visible light. In addition, an alignment film 133a is provided between the liquid crystal 112 and the conductive layer 311a, and the alignment film 133b is provided between the liquid crystal 112 and the conductive layer 113. A polarizing plate 130 is provided on an outer surface of the substrate 361.

In the liquid crystal element 340, the conductive layer 311b has a function of reflecting visible light, and the conductive layer 113 has a function of transmitting visible light. Light entering from the substrate 361 side is polarized by the polarizing plate 130, passes through the conductive layer 113 and the liquid crystal 112, and is reflected by the conductive layer 311b. Then, the light passes through the liquid crystal 112 and the conductive layer 113 again and reaches the polarizing plate 130. In this case, alignment of the liquid crystal is controlled with a voltage that is applied between the conductive layer 311b and the conductive layer 113, and thus optical modulation of light can be controlled. That is, the intensity of light emitted through the polarizing plate 130 can be controlled. Light other than one in a particular wavelength region of the light is absorbed by the coloring layer 131, and thus, emitted light is red light, for example.

The light-emitting element 360 is a bottom-emission light-emitting element. The light-emitting element 360 has a structure in which a conductive layer 191, an EL layer 192, and a conductive layer 193b are stacked in this order from the insulating layer 220 side. In addition, a conductive layer 193a is provided to cover the conductive layer 193b. The conductive layer 193b contains a material reflecting visible light, and the conductive layers 191 and 193a contain a material transmitting visible light. Light is emitted from the light-emitting element 360 to the substrate 361 side through the coloring layer 134, the insulating layer 220, the opening 251, the conductive layer 113, and the like.

Here, as illustrated in FIG. 19, the conductive layer 311a transmitting visible light is preferably provided in the opening 251. Accordingly, the liquid crystal 112 is aligned in a region overlapping with the opening 251 as well as in the other regions, in which case an alignment defect of the liquid crystal is prevented from being generated in the boundary portion of these regions and undesired light leakage can be suppressed.

As the polarizing plate 130 provided on an outer surface of the substrate 361, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 340 are controlled in accordance with the kind of the polarizing plate so that desirable contrast is obtained.

An insulating layer 217 is provided on the insulating layer 216 covering an end portion of the conductive layer 191. The insulating layer 217 has a function of a spacer for preventing the insulating layer 220 and the substrate 351 from being closer to each other than necessary. In addition, in the case where the EL layer 192 or the conductive layer 193a is formed using a blocking mask (metal mask), the insulating layer 217 may have a function of preventing the blocking mask from being in contact with a surface on which the EL layer 192 or the conductive layer 193a is formed. Note that the insulating layer 217 is not necessarily provided.

One of a source and a drain of the transistor 207 is electrically connected to the EL layer 192 of the light-emitting element 360 through the conductive layer 191.

One of a source and a drain of the transistor 206 is electrically connected to the conductive layer 311b through a connection portion 208. The conductive layers 311b and 311a are in contact with and electrically connected to each other. Here, in the connection portion 208, the conductive layers provided on the top and bottom surfaces of the insulating layer 220 are connected to each other through an opening in the insulating layer 220.

A connection portion 204 is provided in a region where the substrate 351 and the substrate 361 do not overlap with each other. The connection portion 204 is electrically connected to the FPC 372 via a connection layer 242. The connection portion 204 has a structure similar to that of the connection portion 208. On the top surface of the connection portion 204, a conductive layer obtained by processing the same conductive film as the conductive layer 311a is exposed. Thus, the connection portion 204 and the FPC 372 can be electrically connected to each other through the connection layer 242.

A connection portion 252 is provided in part of a region where the adhesive layer 141 is provided. In the connection portion 252, the conductive layer obtained by processing the same conductive film as the conductive layer 311a is electrically connected to part of the conductive layer 113 with a connector 243. Accordingly, a signal or a potential input from the FPC 372 connected to the substrate 351 side can be supplied to the conductive layer 113 formed on the substrate 361 side through the connection portion 252.

As the connector 243, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 243, a material capable of elastic deformation or plastic deformation is preferably used. As illustrated in FIG. 19, the connector 243 that is the conductive particle has a shape that is vertically crushed in some cases. With the crushed shape, the contact area between the connector 243 and a conductive layer electrically connected to the connector 243 can be increased, thereby reducing contact resistance and suppressing the generation of problems such as disconnection.

The connector 243 is preferably provided so as to be covered with the adhesive layer 141. For example, the connector 243 is dispersed in the adhesive layer 141 before curing of the adhesive layer 141.

FIG. 19 illustrates an example of the circuit 364 in which the transistors 201a and 201b are provided.

The transistor 201a can be formed through the same process as the transistors 205 and 206. The transistor 201b can be formed through the same process as the transistor 207.

Note that the transistor included in the circuit 364 and the transistor included in the display portion 362 may have the same structure. A plurality of transistors included in the circuit 364 may have the same structure or different structures. A plurality of transistors included in the display portion 362 may have the same structure or different structures.

A material through which impurities such as water or hydrogen do not easily diffuse is preferably used for the insulating layers which cover the transistors, namely, at least one of the insulating layers 212a and 213a and at least one of the insulating layers 212b and 213b. That is, at least one of the insulating layers 212a and 213a and at least one of the insulating layers 212b and 213b can function as barrier films. Such a structure can effectively suppress diffusion of the impurities into the transistors from the outside, and a highly reliable display panel can be provided.

The insulating layer 121 is provided on the substrate 361 side to cover the coloring layer 131 and the light-blocking layer 132. The insulating layer 121 may have a function of a planarization layer. The insulating layer 121 enables the conductive layer 113 to have an almost flat surface, resulting in a uniform alignment state of the liquid crystal 112.

[Components]

The components mentioned above are specifically described below.

[Substrate]

A material having a flat surface can be used as the substrate included in the display panel. The substrate on the side from which light from the display element is extracted is formed using a material transmitting the light. For example, a material such as glass, quartz, ceramics, sapphire, or an organic resin can be used.

The weight and thickness of the display panel can be decreased by using a thin substrate. A flexible display panel can be obtained by using a substrate that is thin enough to have flexibility.

Since the substrate through which light emission is not extracted does not need to have a light-transmitting property, a metal substrate or the like can be used in addition to the above-mentioned substrates. A metal substrate, which has high thermal conductivity, is preferable because it can easily conduct heat to the whole substrate and accordingly can prevent a local temperature rise in the display panel. To obtain flexibility and bendability, the thickness of a metal substrate is preferably greater than or equal to 10 μm and less than or equal to 200 μm, further preferably greater than or equal to 20 μm and less than or equal to 50 μm.

There is no particular limitation on a material of a metal substrate. A metal such as aluminum, copper, or nickel, an aluminum alloy, or an alloy such as stainless steel can be suitably used, for example.

A substrate subjected to insulation treatment, e.g., a metal substrate whose surface is oxidized or provided with an insulating film may be used. The insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

Examples of the material that has flexibility and transmits visible light include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE). It is particularly preferable to use a material with a low thermal expansion coefficient, for example, a material with a thermal expansion coefficient lower than or equal to $30 \times 10^{-6}$/K, such as a polyamide imide resin, a polyimide resin, or PET. A substrate in which a glass fiber is impregnated with an organic resin or a substrate whose thermal expansion coefficient is reduced by mixing an inorganic filler with an organic resin can also be used. A substrate using such a material is lightweight, and thus a display panel using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, a glass fiber using E glass, S glass, D glass, Q glass, or the like can be used. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the substrate. Alternatively, a composite material in which glass and a resin material are attached to each other with an adhesive layer may be used.

A hard coat layer (e.g., a silicon nitride layer and an aluminum oxide layer) by which a surface of a display panel is protected from damage, a layer (e.g., an aramid resin layer) that can disperse pressure, or the like may be stacked over the flexible substrate. Furthermore, to suppress a decrease in lifetime of the display element due to moisture and the like, an insulating film with low water permeability may be stacked over the flexible substrate. For example, an inorganic insulating material such as silicon nitride, silicon oxynitride, silicon nitride oxide, aluminum oxide, or aluminum nitride can be used.

The substrate may be formed by stacking a plurality of layers. When a glass layer is used, a barrier property against water and oxygen can be improved and thus a highly reliable display panel can be provided.

[Transistor]

The transistor includes a conductive layer serving as a gate electrode, a semiconductor layer, a conductive layer serving as a source electrode, a conductive layer serving as a drain electrode, and an insulating layer serving as a gate insulating layer. In the above, a bottom-gate transistor is used.

Note that there is no particular limitation on the structure of the transistor included in the display device of one embodiment of the present invention. For example, a planar transistor, a staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

As a semiconductor material used for the transistors, a metal oxide whose energy gap is greater than or equal to 2 eV, preferably greater than or equal to 2.5 eV, further preferably greater than or equal to 3 eV can be used. A typical example thereof is an oxide semiconductor containing indium, and for example, a CAC-OS described later or the like can be used.

A transistor with an oxide semiconductor having a larger band gap and a lower carrier density than silicon has a low off-state current, and therefore, charges stored in a capacitor that is series-connected to the transistor can be held for a long time.

The semiconductor layer can be, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium).

In the case where the oxide semiconductor contained in the semiconductor layer contains an In-M-Zn-based oxide, it is preferable that the atomic ratio of metal elements of a sputtering target used for forming a film of the In-M-Zn oxide satisfy In≥M and Zn≥M. The atomic ratio of metal elements in such a sputtering target is preferably, for example, In:M:Zn=1:1:1, InM:Zn=1:1:1.2, InM:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio of metal elements in the formed oxide semiconductor layer varies from the above atomic ratios of metal elements of the sputtering targets in a range of ±40%.

The bottom-gate transistor described in this embodiment is preferable because the number of manufacturing steps can be reduced. When an oxide semiconductor, which can be formed at a lower temperature than polycrystalline silicon, is used, materials with low heat resistance can be used for a wiring, an electrode, or a substrate below the semiconductor layer, so that the range of choices of materials can be widened. For example, an extremely large glass substrate can be suitably used.

An oxide semiconductor film with low carrier density is used as the semiconductor layer. For example, the semiconductor layer may be an oxide semiconductor film whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$, even further preferably lower than $1 \times 10^{10}/cm^3$, and higher than or equal to $1 \times 10^{-9}/cm^3$. Such an oxide semiconductor is referred to as a highly purified intrinsic or substantially highly purified intrinsic oxide semiconductor. The oxide semiconductor has a low impurity concentration and a low density of defect states, and thus can be said to have stable characteristics.

Note that, without limitation to those described above, a material with an appropriate composition may be used in accordance with required semiconductor characteristics and electrical characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon that is one of elements belonging to Group 14 is contained in the oxide semiconductor contained in the semiconductor layer, oxygen vacancies are increased in the semiconductor layer, and the semiconductor layer becomes n-type. Thus, the concentration of silicon or carbon (measured by secondary ion mass spectrometry) in the semiconductor layer is set to lower than or equal to $2 \times 10^{18}$ atoms/$cm^3$, preferably lower than or equal to $2 \times 10^{17}$ atoms/$cm^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer, which is measured by secondary ion mass spectrometry, is set to lower than or equal to $1 \times 10^{18}$ atoms/$cm^3$, preferably lower than or equal to $2 \times 10^{16}$ atoms/$cm^3$.

When nitrogen is contained in the oxide semiconductor contained in the semiconductor layer, electrons serving as carriers are generated and the carrier density increases, so that the semiconductor layer easily becomes n-type. Thus, a transistor including an oxide semiconductor that contains nitrogen is likely to be normally on. Hence, the concentration of nitrogen in the semiconductor layer, which is measured by secondary ion mass spectrometry, is preferably set to lower than or equal to $5 \times 10^{18}$ atoms/$cm^3$.

The semiconductor layer may have a non-single-crystal structure, for example. The non-single-crystal structure includes CAAC-OS (c-axis aligned crystalline oxide semiconductor, or c-axis aligned a-b-plane-anchored crystalline oxide semiconductor) including a c-axis aligned crystal, a polycrystalline structure, a microcrystalline structure, or an amorphous structure, for example. Among the non-single-crystal structures, an amorphous structure has the highest density of defect states, whereas CAAC-OS has the lowest density of defect states.

An oxide semiconductor film having an amorphous structure has disordered atomic arrangement and no crystalline component, for example. In another example, an oxide film having an amorphous structure has an absolutely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single-crystal structure. The mixed film has, for example, a single-layer structure or a stacked-layer structure including two or more of the above-described regions in some cases.

<Composition of CAC-OS>

Described below is the composition of a cloud-aligned composite oxide semiconductor (CAC-OS) which can be used for a transistor disclosed in one embodiment of the present invention.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region is described as having higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Thus, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part of the CAC-OS, and these nanoparticle regions are randomly dispersed to form a mosaic pattern in the CAC-OS.

The CAC-OS can be formed by a sputtering method under a condition where a substrate is not heated, for example. In the case where the CAC-OS is formed by a sputtering method, one or more of an inert gas (typically, argon) and an oxygen gas may be used as a deposition gas. The flow rate of the oxygen gas to the total flow rate of the deposition gas in deposition is preferably as low as possible, for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an out-of-plane method with an X-ray diffraction (XRD). That is, it is found by the XRD that there are no alignment in the a-b plane direction and no alignment in the c-axis direction in the measured areas.

In the CAC-OS, an electron diffraction pattern that is obtained by irradiation with an electron beam with a probe diameter of 1 nm (also referred to as nanobeam electron beam) has regions with high luminance in a ring pattern and a plurality of bright spots appear in the ring-like pattern. Thus, it is found from the electron diffraction pattern that the crystal structure of the CAC-OS includes a nanocrystalline (nc) structure that does not show alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the regions including $GaO_{X3}$ as a main component and the regions including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is generated. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

Alternatively, silicon may be used as a semiconductor in which a channel of a transistor is formed. Although amorphous silicon may be used as silicon, silicon having crystallinity is particularly preferable. For example, microcrystalline silicon, polycrystalline silicon, single crystal silicon, or the like is preferably used. In particular, polycrystalline silicon can be formed at a lower temperature than single crystal silicon and has higher field effect mobility and higher reliability than amorphous silicon.

The bottom-gate transistor described in this embodiment is preferable because the number of manufacturing steps can be reduced. When amorphous silicon, which can be formed at a lower temperature than polycrystalline silicon, is used for the semiconductor layer, materials with low heat resistance can be used for a wiring, an electrode, or a substrate below the semiconductor layer, resulting in wider choice of materials. For example, an extremely large glass substrate can be suitably used. Meanwhile, the top-gate transistor is preferable because an impurity region is easily formed in a self-aligned manner and variation in characteristics can be reduced. In that case, the use of polycrystalline silicon, single crystal silicon, or the like is particularly suitable.

[Conductive Layer]

As materials for conductive layers such as wirings and electrodes included in a display device, a gate, a source, and a drain of a transistor; any of metals such as aluminum, titanium, chromium, nickel, copper, yttrium, zirconium, molybdenum, silver, tantalum, and tungsten, or an alloy containing any of these metals as its main component can be used. A single-layer structure or multi-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because the controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case where the metal material or the alloy material (or the nitride thereof) is used, the thickness is set small enough to be able to transmit light. Alternatively, a stack of any of the above materials can be used as the conductive layer. For example, a stacked film of indium tin oxide and an alloy of silver and magnesium is preferably used because the conductivity can be increased. They can be used for conductive layers such as a variety of wirings and electrodes included in a display device, and conductive layers (e.g., conductive layers serving as a pixel electrode or a common electrode) included in a display element.

[Insulating Layer]

Examples of an insulating material that can be used for the insulating layers include a resin such as acrylic or epoxy resin, a resin having a siloxane bond, and an inorganic insulating material such as silicon oxide, silicon oxynitride, silicon nitride oxide, silicon nitride, or aluminum oxide.

The light-emitting element is preferably provided between a pair of insulating films with low water permeability, in which case impurities such as water can be prevented from entering the light-emitting element, thereby preventing a decrease in the reliability of the device.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. A silicon oxide film, a silicon oxynitride film, an aluminum oxide film, or the like may also be used.

For example, the water vapor transmittance of the insulating film with low water permeability is lower than or equal to $1 \times 10^{-5}$ [g/(m$^2$·day)], preferably lower than or equal to $1 \times 10^{-6}$ [g/(m$^2$·day)], further preferably lower than or equal to $1 \times 10^{-7}$ [g/(m$^2$·day)], and still further preferably lower than or equal to $1 \times 10^{-8}$ [g/(m$^2$·day)].

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes; for example, other than the VA mode, a twisted nematic (TN) mode, an in-plane switching (IPS) mode, a fringe field switching (FFS) mode, an axially symmetric aligned microcell (ASM) mode, an optically compensated birefringence (OCB) mode, a ferroelectric liquid crystal (FLC) mode, or an antiferroelectric liquid crystal (AFLC) mode can be used.

The liquid crystal element controls the transmission or non-transmission of light by utilizing an optical modulation action of a liquid crystal. Note that the optical modulation action of the liquid crystal is controlled by an electric field applied to the liquid crystal (including a horizontal electric field, a vertical electric field, or an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either a positive liquid crystal or a negative liquid crystal may be used, and an appropriate liquid crystal material can be used in accordance with the mode or design to be used.

An alignment film can be provided to adjust the alignment of a liquid crystal. In the case where a horizontal electric field mode is employed, a liquid crystal exhibiting a blue phase for which an alignment film is unnecessary may be used. The blue phase is a liquid crystal phase, which is generated just before a cholesteric phase changes into an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process and reduces the viewing angle dependence. Since the alignment film does not need to be provided, rubbing treatment is not necessary; accordingly, electrostatic discharge damage caused by the rubbing treatment can be prevented, reducing defects and damage of a liquid crystal display device in the manufacturing process.

The liquid crystal element may be a transmissive liquid crystal element, a reflective liquid crystal element, a semi-transmissive liquid crystal element, or the like.

In one embodiment of the present invention, in particular, the reflective liquid crystal element can be used.

In the case where a transmissive or semi-transmissive liquid crystal element is used, two polarizing plates are provided such that a pair of substrates are sandwiched therebetween. Furthermore, a backlight is provided outside the polarizing plates. The backlight may be a direct-below backlight or an edge-light backlight. The direct-below backlight including a light-emitting diode (LED) is preferably used because local dimming is easily performed to improve contrast. The edge-light type backlight is preferably used because the thickness of a module including the backlight can be reduced.

In the case where a reflective liquid crystal element is used, a polarizing plate is provided on the display surface side. In addition, a light diffusion plate is preferably provided on the display surface side to improve visibility.

In the case where the reflective or the semi-transmissive liquid crystal element is used, a front light may be provided outside the polarizing plate. As the front light, an edge-light front light is preferably used. A front light including a light-emitting diode (LED) is preferably used to reduce power consumption.

[Light-Emitting Element]

As the light-emitting element, a self-luminous element can be used, and an element whose luminance is controlled by current or voltage is included in the category of the light-emitting element. For example, an LED, an organic EL element, an inorganic EL element, or the like can be used.

The light-emitting element has a top emission structure, a bottom emission structure, a dual emission structure, or the like. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer, either a low-molecular compound or a high-molecular compound can be used, and an inorganic compound may also be used. Each of the layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer and a light-emitting substance contained in the EL layer emits light.

In the case where a light-emitting element emitting white light is used as the light-emitting element, the EL layer preferably contains two or more kinds of light-emitting substances. For example, the two or more kinds of light-emitting substances are selected so as to emit light of complementary colors to obtain white light emission. Specifically, it is preferable to contain two or more selected from light-emitting substances emitting light of red (R), green (G), blue (B), yellow (Y), orange (O), and the like and light-emitting substances emitting light containing two or more of spectral components of R, G, and B. The light-emitting element preferably emits light with a spectrum having two or more peaks in the wavelength range of a visible light region (e.g., 350 nm to 750 nm). An emission spectrum of a material emitting light having a peak in a yellow wavelength range preferably includes spectral components also in green and red wavelength ranges.

A light-emitting layer containing a light-emitting material emitting light of one color and a light-emitting layer containing a light-emitting material emitting light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or the phosphorescent layer (e.g., a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stacked film of any of the above materials can be used for the conductive layers. For example, a stacked film of indium tin oxide and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy containing silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the above conductive film that transmits visible light and a film containing a metal material may be stacked. For example, a stack of silver and indium tin oxide, a stack of an alloy of silver and magnesium and indium tin oxide, or the like can be used.

Each of the electrodes can be formed by an evaporation method or a sputtering method. Alternatively, a discharging method such as an inkjet method, a printing method such as a screen printing method, or a plating method may be used.

Note that the aforementioned light-emitting layer and layers containing a substance with a high hole-injection property, a substance with a high hole-transport property, a substance with a high electron-transport property, a substance with a high electron-injection property, and a substance with a bipolar property may include an inorganic compound such as a quantum dot or a high molecular compound (e.g., an oligomer, a dendrimer, or a polymer). For example, used for the light-emitting layer, the quantum dot can serve as a light-emitting material.

The quantum dot may be a colloidal quantum dot, an alloyed quantum dot, a core-shell quantum dot, a core quantum dot, or the like. The quantum dot containing elements belonging to Groups 12 and 16, elements belonging to Groups 13 and 15, or elements belonging to Groups 14 and 16, may be used. Alternatively, the quantum dot containing an element such as cadmium, selenium, zinc, sulfur, phosphorus, indium, tellurium, lead, gallium, arsenic, or aluminum may be used.

[Adhesive Layer]

As the adhesive layer, a variety of curable adhesives such as a reactive curable adhesive, a thermosetting adhesive, an anaerobic adhesive, and a photocuring adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

The resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent impurities such as moisture from entering the element, thereby improving the reliability of the display panel.

In addition, it is preferable to mix a filler with a high refractive index or light-scattering member into the resin, in which case light extraction efficiency can be enhanced. For example, titanium oxide, barium oxide, zeolite, zirconium, or the like can be used.

[Connection Layer]

As the connection layer, an anisotropic conductive film (ACF), an anisotropic conductive paste (ACP), or the like can be used.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer that transmits light of a certain color and a film containing a material of a coloring layer that transmits light of another color can be employed. It is preferable that the coloring layer and the light-blocking layer be formed using the same material because the same manufacturing apparatus can be used and the process can be simplified.

At least part of this embodiment can be implemented in combination with any of the other embodiments described in this specification as appropriate.

Embodiment 4

Examples of an electronic device that can use the display device of one embodiment of the present invention include display devices, personal computers, image storage devices or image reproducing devices provided with storage media, cellular phones, game machines (including portable game machines), portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. Specific examples of these electronic devices are illustrated in FIGS. 20A to 20F.

Figure 20A:
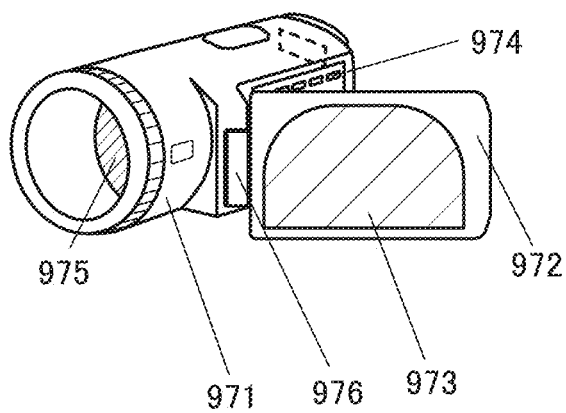
FIGS. 20A to 20F each illustrate an electronic device.

FIG. 20A illustrates a video camera, which includes a first housing 971, a second housing 972, a display portion 973, operation keys 974, a lens 975, a joint 976, and the like. The operation keys 974 and the lens 975 are provided on the first housing 971, and the display portion 973 is provided on the second housing 972. The display portion 973 of the video camera includes the display device of one embodiment of the present invention, so that outdoor visibility can be improved and low power consumption can be achieved.

Figure 20B:
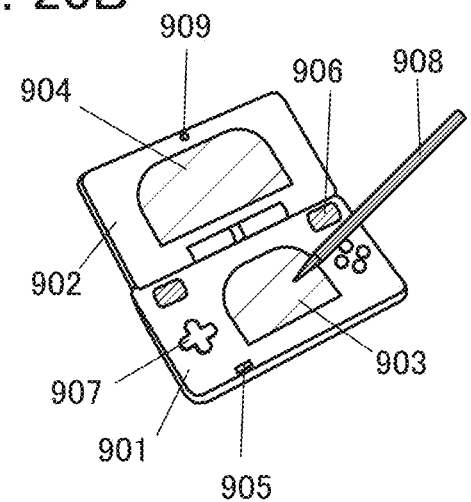

FIG. 20B illustrates a portable game machine, which includes a housing 901, a housing 902, a display portion 903, a display portion 904, a microphone 905, speakers 906, an operation key 907, a stylus 908, a camera 909, and the like. Although the portable game machine in FIG. 20B has the two display portions 903 and 904, the number of display portions included in a portable game machine is not limited to this. The display portion 903 of the portable game machine includes the display device of one embodiment of the present invention, so that outdoor visibility can be improved and low power consumption can be achieved.

Figure 20C:
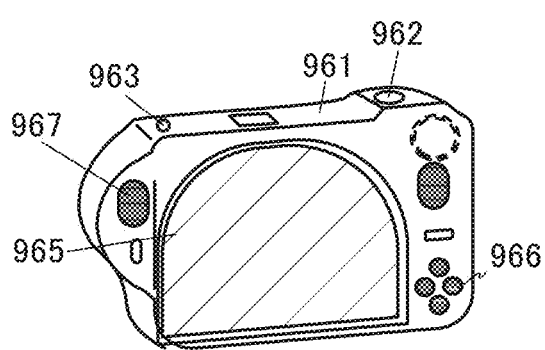

FIG. 20C illustrates a digital camera, which includes a housing 961, a shutter button 962, a microphone 963, a speaker 967, a display portion 965, operation keys 966, and the like. The display portion 965 of the digital camera includes the display device of one embodiment of the present invention, so that outdoor visibility can be improved and low power consumption can be achieved.

Figure 20D:
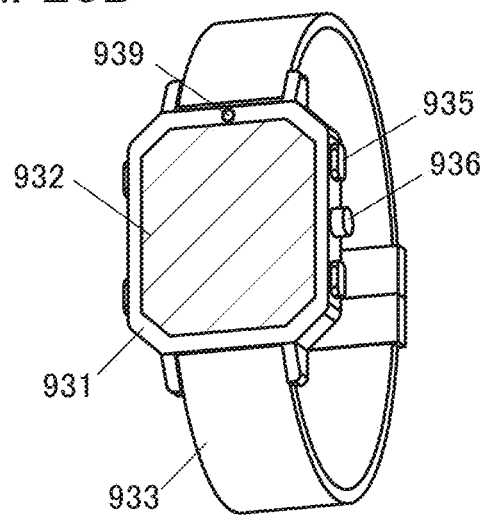

FIG. 20D illustrates a wrist-watch-type information terminal, which includes a housing 931, a display portion 932, a wristband 933, operation buttons 935, a winder 936, a camera 939, and the like. The display portion 932 may be a touch panel. The display portion 932 of the information terminal includes the display device of one embodiment of the present invention, so that outdoor visibility can be improved. Furthermore, the bezel can be narrowed, and thus the design can be improved.

Figure 20E:
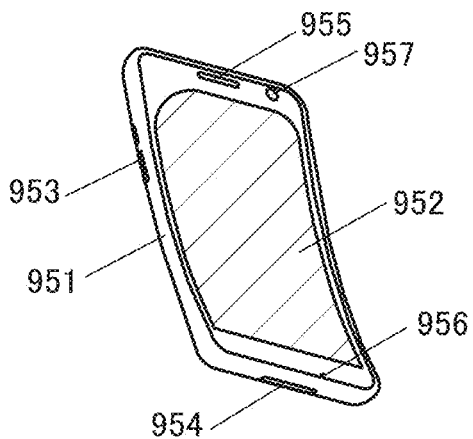

FIG. 20E is an example of a mobile phone, which includes a housing 951, a display portion 952, an operation button 953, an external connection port 954, a speaker 955, a microphone 956, a camera 957, and the like. The mobile phone includes a touch sensor in the display portion 952. Operations such as making a call and inputting characters can be performed by touch on the display portion 952 with a finger, a stylus, or the like. The display portion 952 of the mobile phone includes the display device of one embodiment of the present invention, so that outdoor visibility can be improved. Furthermore, the bezel can be narrowed, and thus the design can be improved.

Figure 20F:
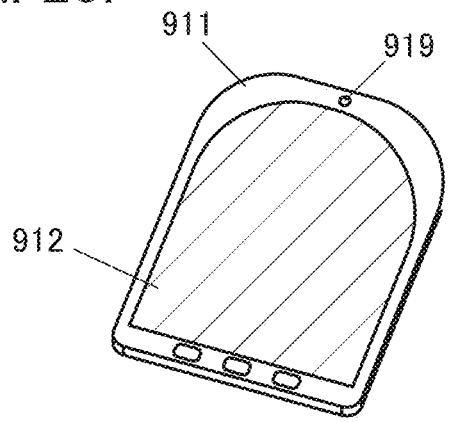

FIG. 20F illustrates a portable data terminal, which includes a housing 911, a display portion 912, a camera 919, and the like. The touch panel function of the display portion 912 enables input and output of data. The display portion 912 of the portable data terminal includes the display device of one embodiment of the present invention, so that outdoor visibility can be improved. Furthermore, the bezel can be narrowed, and thus the portable data terminal can be small.

At least part of this embodiment can be implemented in combination with any of the other embodiments described in this specification as appropriate.

This application is based on Japanese Patent Application Serial No. 2016-144075 filed with Japan Patent Office on Jul. 22, 2016, the entire contents of which are hereby incorporated by reference.

What is claimed is:

1. A display device comprising:
a display portion comprising:
  a first transistor comprising:
    a first gate electrode over a substrate;
    a fourth insulating layer over the first gate electrode, the fourth insulating layer having a region which functions as a first gate insulating layer; and
    a first semiconductor layer over the fourth insulating layer, the first semiconductor layer having a channel formation region of the first transistor;
  a second transistor over the first transistor, the second transistor comprising:
    a second gate electrode over the first semiconductor layer;
    a fifth insulating layer over the second gate electrode, the fifth insulating layer having a region which functions as a second gate insulating layer;
    a second semiconductor layer over the fifth insulating layer, the second semiconductor layer having a channel formation region of the second transistor; and
  a source electrode and a drain electrode over the second semiconductor layer; and
  a light-emitting element over the second transistor, the light-emitting element comprising:
    a first conductive layer over the source electrode and the drain electrode of the second transistor;
    an EL layer over the first conductive layer; and
    a second conductive layer over the EL layer; and
a scan line driver circuit comprising a third transistor, the third transistor comprising:
  a third gate electrode over the substrate;
  the fourth insulating layer over the third gate electrode; and
  a third semiconductor layer over the fourth insulating layer, wherein the display device further comprises:
  a first insulating layer over the first semiconductor layer;
  a second insulating layer over the second semiconductor layer; and
  a third insulating layer over the second insulating layer,
wherein the second insulating layer has a region in contact with each of the second semiconductor layer, the source electrode of the second transistor, the drain electrode of the second transistor, and the fifth insulating layer, and
wherein the second semiconductor layer comprises an oxide semiconductor.

2. The display device according to claim 1, wherein the oxide semiconductor comprises a crystal structure.

3. The display device according to claim 1, wherein the oxide semiconductor comprises indium, gallium, and zinc.

4. The display device according to claim 1, wherein each of the first semiconductor layer and the third semiconductor layer comprises a polycrystalline semiconductor.

5. The display device according to claim 1, wherein the third insulating layer has a function of a planarization layer.

6. The display device according to claim 1, wherein the display portion further comprises a capacitor, and
wherein the capacitor comprises a region extending the second gate electrode.

7. A display device comprising:
a display portion comprising:
  a first transistor comprising:
    a first gate electrode over a substrate;
    a fourth insulating layer over the first gate electrode, the fourth insulating layer having a region which functions as a first gate insulating layer; and
    a first semiconductor layer over the fourth insulating layer, the first semiconductor layer having a channel formation region of the first transistor;
  a second transistor over the first transistor, the second transistor comprising:
    a second gate electrode over the first semiconductor layer;
    a fifth insulating layer over the second gate electrode, the fifth insulating layer having a region which functions as a second gate insulating layer;
    a second semiconductor layer over the fifth insulating layer, the second semiconductor layer having a channel formation region of the second transistor;
    a third conductive layer over the second semiconductor layer, the third conductive layer having a region which functions as a source electrode; and
    a fourth conductive layer over the second semiconductor layer, the fourth conductive layer having a region which functions as a drain electrode; and
  a light-emitting element over the second transistor, the light-emitting element comprising:
    a first conductive layer over the third conductive layer and the fourth conductive layer;
    an EL layer over the first conductive layer; and
    a second conductive layer over the EL layer; and
a scan line driver circuit comprising a third transistor, the third transistor comprising:
  a third gate electrode over the substrate;
  the fourth insulating layer over the third gate electrode; and
  a third semiconductor layer over the fourth insulating layer,
wherein the display device further comprises:
  a first insulating layer over the first semiconductor layer;
  a second insulating layer over the second semiconductor layer; and
  a third insulating layer over the second insulating layer,
wherein the second insulating layer has a region in contact with each of the second semiconductor layer, the third conductive layer, the fourth conductive layer, and the fifth insulating layer, and
wherein the second semiconductor layer comprises an oxide semiconductor.

8. The display device according to claim 7, wherein the oxide semiconductor comprises a crystal structure.

9. The display device according to claim 7, wherein the oxide semiconductor comprises indium, gallium, and zinc.

10. The display device according to claim 7, wherein each of the first semiconductor layer and the third semiconductor layer comprises a polycrystalline semiconductor.

11. The display device according to claim 7, wherein the third insulating layer has a function of a planarization layer.

12. The display device according to claim 7,
wherein the display portion further comprises a capacitor, and
wherein the capacitor comprises a region extending the second gate electrode.

* * * * *